United States Patent [19]
Zogakis et al.

[11] Patent Number: 5,774,500
[45] Date of Patent: Jun. 30, 1998

[54] MULTI-CHANNEL TRELLIS SHAPER

[75] Inventors: T. Nicholas Zogakis, Mountain View; John M. Cioffi, Cupertino, both of Calif.

[73] Assignee: Board of Trustees, The Leland Stanford Jr., University, Stanford, Calif.

[21] Appl. No.: 569,759

[22] Filed: Dec. 8, 1995

[51] Int. Cl.[6] .................................................. H04L 27/34
[52] U.S. Cl. .......................... 375/261; 375/265; 375/298; 375/340; 371/30; 371/43.4
[58] Field of Search .................................. 375/260–261, 375/265, 298, 324, 340, 341; 371/43, 30, 43.4; 348/385, 388; 370/206, 207, 210, 464, 480, 483

[56] References Cited

U.S. PATENT DOCUMENTS

| | | | |
|---|---|---|---|
| 4,980,897 | 12/1990 | Decker et al. | 375/265 |
| 5,243,629 | 9/1993 | Wei | 375/299 |
| 5,400,322 | 3/1995 | Hunt et al. | 370/19 |
| 5,493,586 | 2/1996 | Brownlie et al. | 375/265 |
| 5,596,604 | 1/1997 | Cioffi et al. | 375/260 |

*Primary Examiner*—Stephen Chin
*Assistant Examiner*—Amanda T. Le
*Attorney, Agent, or Firm*—Claude A. S. Hamrick

[57] ABSTRACT

A trellis shaper for multi-channel modulation is provided as a means for obtaining significant shaping gain in applications requiring high-performance transceivers. The trellis shaper works across the subchannels in the multi-channel system and accommodates both the variable amounts of power and the different constellation sizes associated with the various tones. This invention offers significant advantage over the more straightforward approach of shaping each subchannel independently in terms of a reduction in delay, a reduction in memory requirements, and a reduction in complexity.

22 Claims, 20 Drawing Sheets

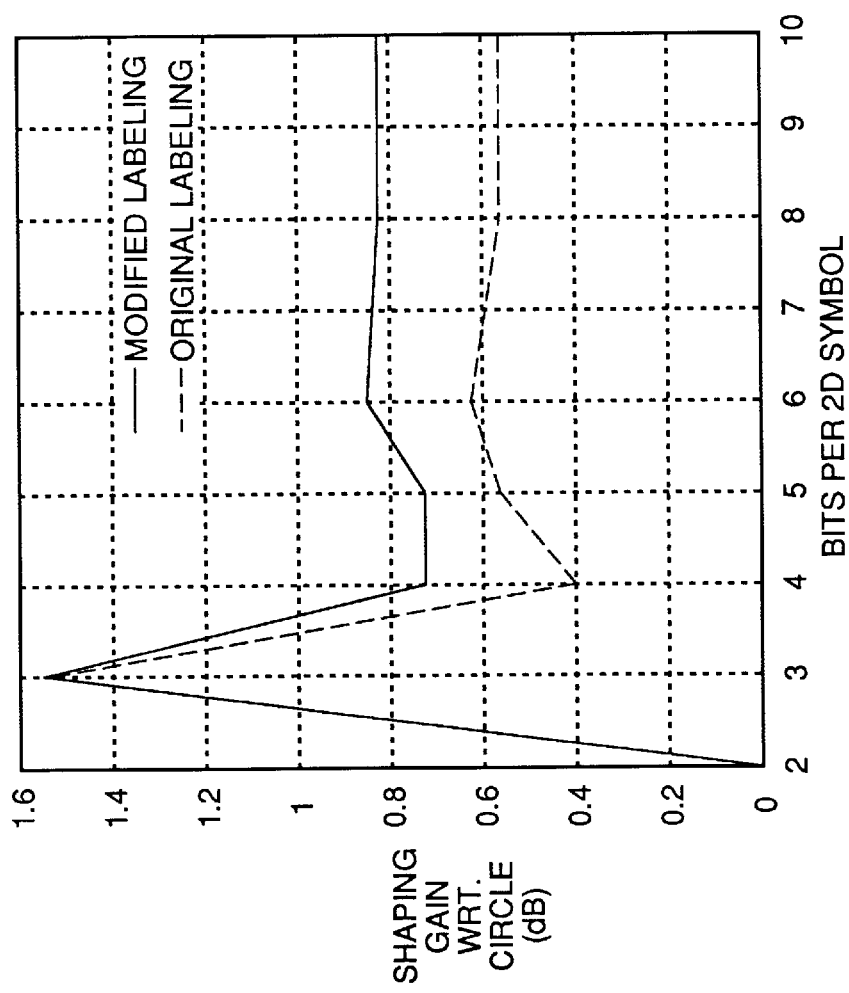

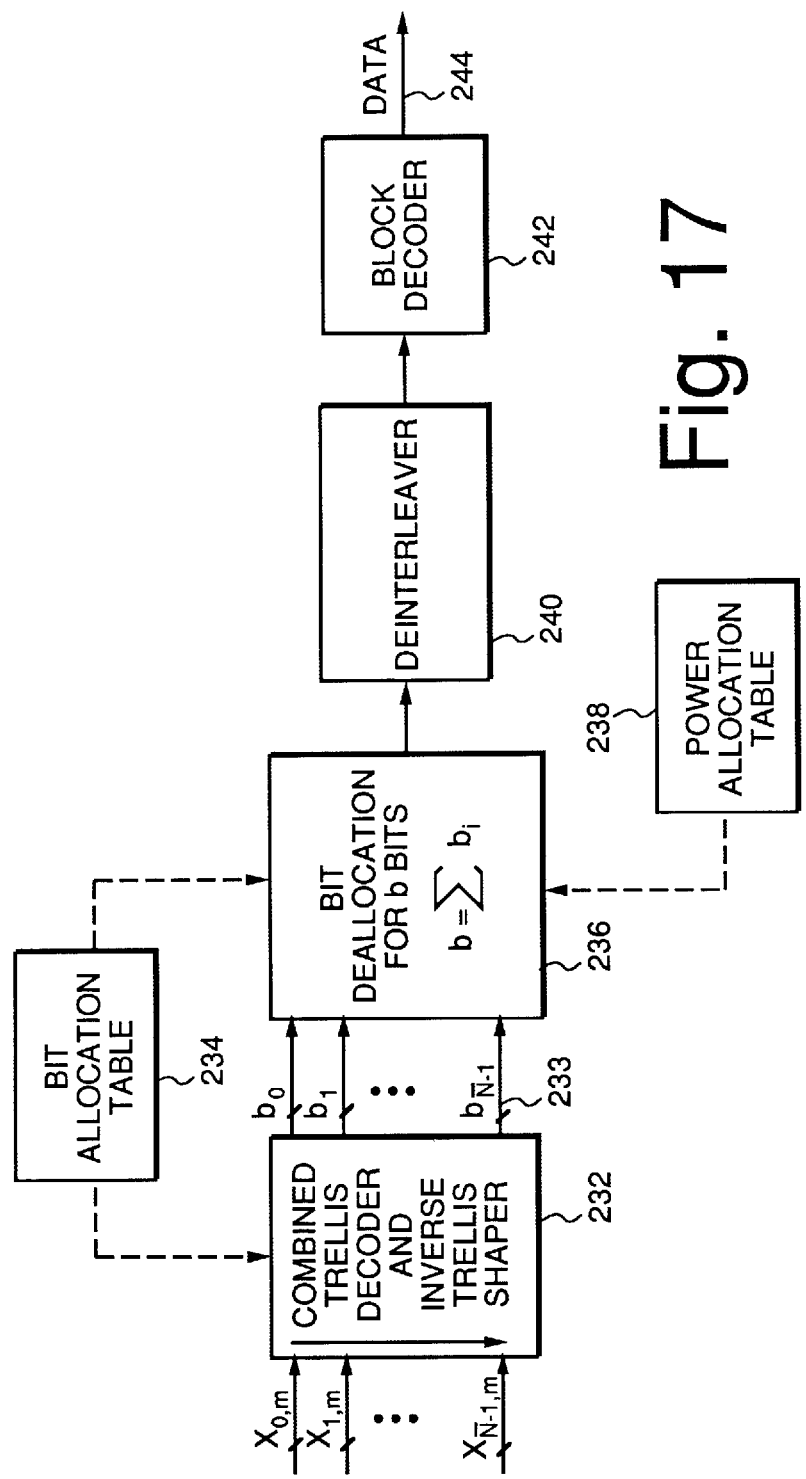

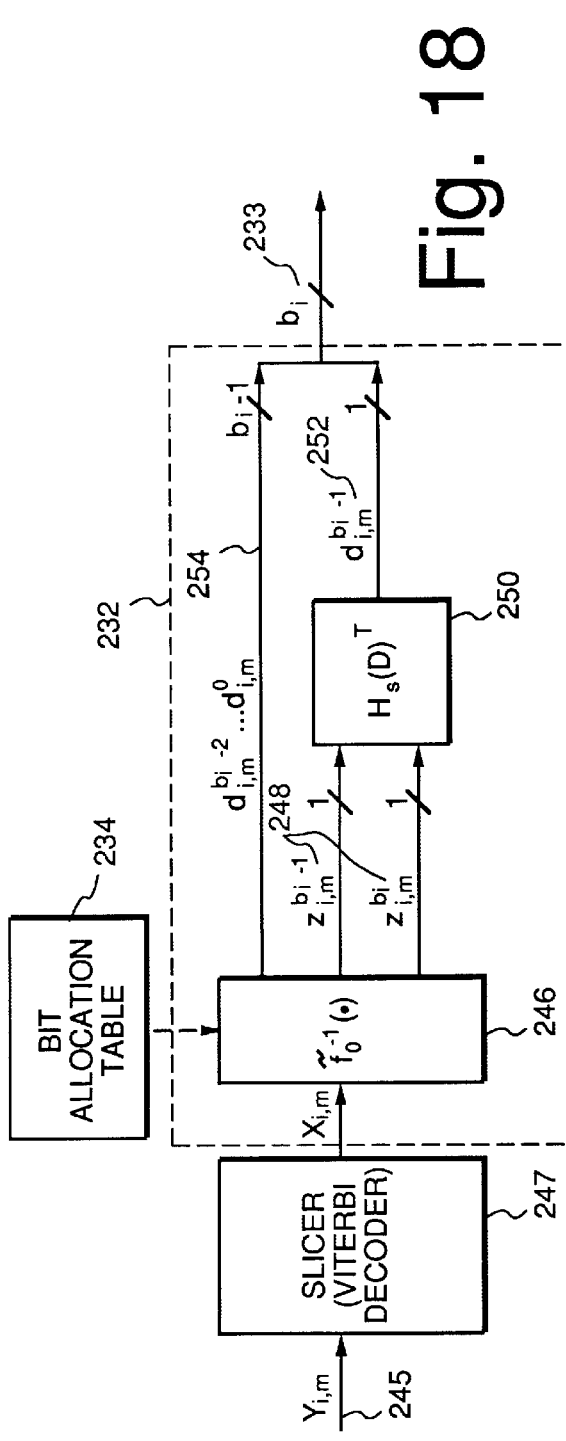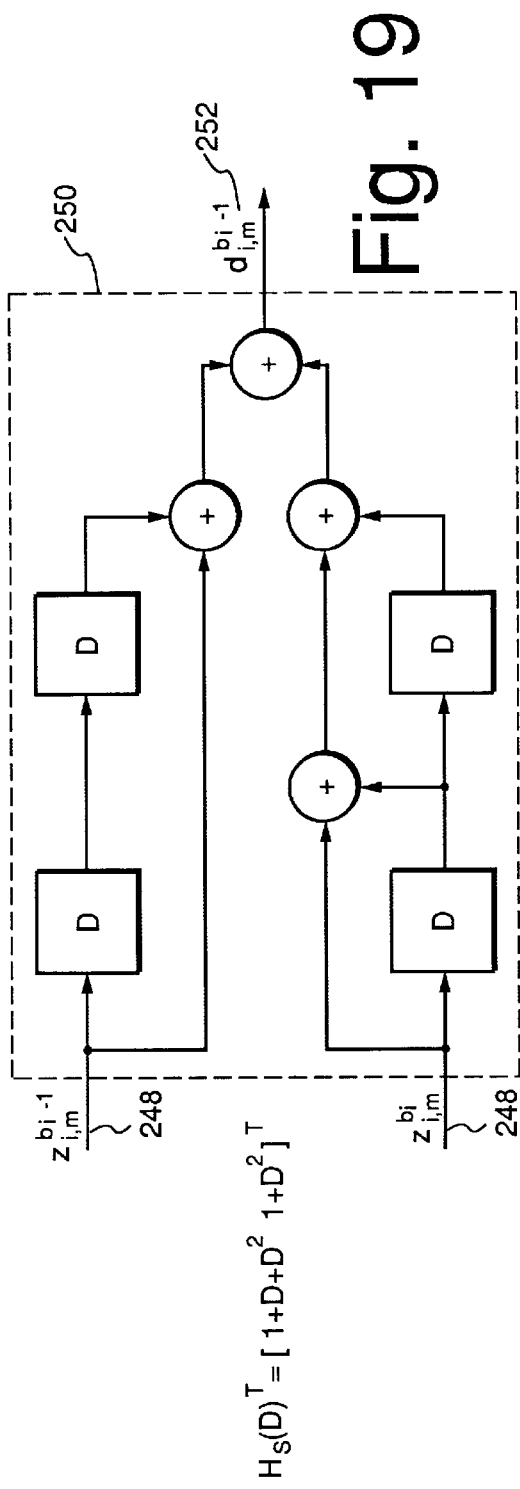

MULTI-CHANNEL TRELLIS SHAPER

BACKGROUND OF THE INVENTION

1. Field of the Invention

The present invention generally relates to methods for use in digital communication, in particular, a method for multi-channel trellis shaping.

2. Brief Description of the Prior Art

The purpose of this invention is to provide a method for achieving significant shaping gain with acceptable delay and practical memory requirements in a discrete multitone (DMT) modulation system. Shaping gain refers to the saving or reduction in transmit power afforded by choosing a spherical constellation rather than a cubical constellation. It is shown by G. D. Forney Jr. and Lee-Fang Wei in *Multi-dimensional Constellations-Part I: Introduction, Figures of Merit, and Generalized Cross Constellations, IEEE Journal on Selected Areas in Communications*, vol. 7, no. 6, pp. 877–892, August 1989, that the maximum possible shaping gain is 1.53 dB.

While a number of shaping approaches have been proposed for single-carrier modulation, the application of shaping to a DMT system is complicated by the variation in constellation sizes and possibly transmit power from tone to tone. The straightforward approach would be to apply an optimized, single-carrier shaper independently to each subchannel in the DMT system. However, this would result in excessive delay and overbearing memory requirements. Furthermore, the number of shapers required would depend upon the number of subchannels used for transmission, which could be quite large. Hence, this invention shows how one of the single-carrier approaches, namely trellis shaping, may be modified to work with DMT modulation.

Ideal discrete multitone modulation effectively partitions a channel into a number of independent, memoryless subchannels, each of which can be considered as supporting a low-speed quadrature amplitude modulated (QAM) signal. FIG. 1 presents a basic block diagram of a DMT transmitter. At the input 10 to the system, the bit stream is partitioned into blocks of size b=RT bits 12, where R is the input uncoded bit rate, T is the multitone symbol period, and b is the number of bits contained in one multitone symbol. The bits collected during the $m^{th}$ symbol interval are allocated among $\overline{N}$ subchannels or tones 14 in a manner determined during system initialization with $b_i$ bits designated to tone i and $\Sigma b_i = b$. In FIG. 1, $b_i$ designates the number of bits on subchannel i and $d_{i,m}$ indicates the actual value of these bits at symbol time m. On subchannel i, the bits $d_{i,m}$ are mapped 18 to a constellation point $X_{i,m}$ in a constellation of size $2^{b_i}$, and the collection of constellation points $\{X_{i,m} \mid i=0, \ldots, \overline{N} - 1\}$ serves as the input to an Inverse Fast Fourier Transform (IFFT) block 22. The time-domain signal that is transmitted over the channel is obtained by performing a length $2\overline{N}$ IFFT on the complex points, where proper conjugacy constraints are imposed to ensure a real valued signal 24. Since the IFFT is an orthogonal transformation, the average transmit power at the input to the transformation will equal that at the output. The output signals pass through a parallel to serial conversion process 26 to form the signal 28 that is transmitted over the channel.

To reduce memory requirements in actual implementations, the various size constellations required across the tones are supported by one of two methods. In the first method, a large constellation is stored in memory and an embedded labelling scheme is used to access the smaller constellations which are subsets of the large, stored constellation. Under this method, a simple approach is to order the constellation points according to their energy and to assign lower labels to points with lower energy requirement where labels are interpreted as unsigned integers to form the ordering. The resulting constellations are embedded circles, as illustrated in FIG. 2 where a 512-point constellation (supporting 9 bits) is represented by the inner asterisks circle and a 1024-point constellation (supporting 10 bits) is represented by the entire circle. In the second method, an algorithmic encoder is employed to generate constellation points from given labels. In this method, typically square (for $b_i$ even) and cross (for $b_i$ odd) constellations are used because it is a relatively simple task to derive algorithms for mapping labels to points for these constellations. FIG. 3 illustrates a 512-point cross constellation and a 1024-point square constellation separately generated by an algorithmic encoder. Note that the 1024-point circular constellation in FIG. 2 is more power efficient than the 1024-point square constellation in FIG. 3. The difference (in dB) in the amount of power required is an example of the shaping gain provided by a circular constellation over a square constellation in a two dimensional case. The shaping gain is relatively modest in two dimensions (asymptotically 0.2 dB). The present invention illustrates how multidimensional shaping techniques can be applied to DMT systems to achieve on the order of 1.0 dB of gain with relative ease.

In addition to the bit distribution $\{b_i\}$, a power distribution is also determined during DMT system initialization. The power allocated to each subchannel determines the size of the two-dimensional region covered by each constellation. For instance, in the case of a flat power allocation (same power to each subcarrier) and given circular constellations, each constellation will have approximately the same radius, regardless of the number of constellation points.

Constellations are typically stored or generated based on some defined minimum distance between constellation points, and proper scaling is obtained by first mapping the constellation label to a point on the generic constellation and then multiplying the constellation point by a constant that is stored in the power allocation table.

In summary, a DMT scenario is distinguished from a single-carrier scenario in that the constellation sizes may be variable and the power may vary from tone to tone.

SEPARATE TRELLIS SHAPERS

In order to provide a contrast to the present invention, basic concepts of a single-carrier trellis shaping technique is reviewed, as well as the approach of applying trellis shaping independently to each tone. A four-state, 2D trellis shaper as discussed by G. D. Forney Jr., *Trellis Shaping, IEEE transactions on Information Theory*, vol. 38, no. 2, pp. 281–300, March 1992, is used and an embedded labeling scheme with circular constellations is presumed for the present discussion.

FIG. 4 depicts a trellis shaper applied to the $i^{th}$ subchannel. Here, the sequence of most significant bits $\{d_{i,m}^{b_i-1}\}$ as indicated at 30 is passed through a coset representative generator 32, $(H_s^{-1}(D))^T$, to form an initial sequence of region specifier bits $\{v_{i,m}^{b_i}, v_{i,m}^{b_i-1}\}$ as indicated at 34. Since circular constellations are used (for the present discussion) and the labeling scheme assigns lower labels to lower energy points, the region specifier bits $\{v_{i,m}^{b_i}, v_{i,m}^{b_i-1}\}$ produced during symbol period m designate one of four concentric circular rings. This concept is depicted in the left-hand side of FIG. 5A where the four regions are labeled with the four possible values of $\{v_{i,m}^{b_i}, v_{i,m}^{b_i-1}\}$. The sequence $\{v_{i,m}^{b_i}, v_{i,m}^{b_i-1}\}$ is subsequently modified by the modulo two addition of a codeword $\{c_{i,m}^1, c_{i,m}^0\}$ from the rate one-half convolutional code with generator matrix $G_s(D)=[1+D^2, 1+D+D^2]$ and parity check matrix $H_s(D)$ to form the sequence $\{z_{i,m}^{b_i}, z_{i,m}^{b_i-1}\}$, which equals $\{v_{i,m}^{b_i} \oplus c_{i,m}^1, v_{i,m}^{b_i-1} \oplus c_{i,m}^0\}$. The choice of codeword is determined by performing the Viterbi algorithm 38 to search for the lowest energy sequence of an equivalence class of possible transmit sequences as discussed in the article by G. D. Forney Jr. In particular, the squared magnitude of the constellation point $Y_{i,m}=f_0[z_{i,m}^{b_i}, z_{i,m}^{b_i-1}, d_{i,m}^{b_i-2}, \ldots, d_{i,m}^1, d_{i,m}^0]$ may serve as the weight of a branch in the trellis for the shaping code, where the branch is associated with the label $c_{i,m}^1 c_{i,m}^0$ and $f_0[]$ denotes the mapping of labels to constellation points. A mapping operation $f_0[]$ 40 is subsequently performed to obtain a point from the stored constellation, and this point is scaled according to the power distribution to obtain the transmitted point $X_{i,m}$ as indicated at 42.

It is determined from simulation results that the shaping gain of the above scheme is on the order of 1.0 dB with respect to a square constellation for the case of a 128-point constellation. However, in the DMT case, it is of interest to know the shaping gain as a function of the unshaped constellation size. FIG. 5 presents shaping gain results determined by simulation for constellations supporting anywhere from two to 10 bits, where the shaping gains depicted are with respect to the original unshaped circular constellation. The lower curve in FIG. 5 corresponds to the case in which the original embedded labeling scheme was maintained, whereas the upper curve was achieved when the labeling scheme was modified such that the points in the outer-most and next-to-inner-most rings were labeled from high energy to low energy and the two most-significant bits of each constellation label in the two middle rings were interchanged. The latter modification is equivalent to interchanging the definitions of regions one and two. FIG. 5A compares the standard embedded labeling scheme (left-hand side) with the modified labeling scheme (right-hand side) for an arbitrary constellation size, where the arrows indicate the direction of increasing constellation labels within each region.

The dependency of the achievable shaping gain on the size of the constituent constellation implies that the overall shaping gain will depend on the DMT scenario and in particular on the bit and power distributions. Signifying the dependency of shaping gain on the constellation size $2^{b_i}$ as $\gamma_s(b_i)$, the total shaping gain realized for the DMT system may be expressed as:

$$\gamma_{s,tot} = \frac{\sum_{i \in v} P_i}{\sum_{i \in v} \frac{P_i}{\gamma_s(b_i)}} \quad \text{(equ. 1)}$$

where $\{P_i\}$ denotes the power distribution. The summation in equation 1 is taken over the set of indices v corresponding to tones actually used for transmission (i.e. $i \in v$ if $b_i>0$).

The application of a separate trellis shaper to each tone clearly becomes infeasible for a large number of tones. For instance, if the DMT system uses length 512 FFTs and assuming that DC and Nyquist are never available for transmission, the number of trellis shapers required may be as large as 255. Moreover, there is a delay associated with the Viterbi algorithm, and the total delay and buffer requirements for separate trellis shapers would make this approach unacceptable for most applications. Finally, while theoretically a separate constellation with the modified labeling scheme could be stored for each constellation size, in practice one large constellation is stored or an algorithmic encoder is used. Hence, from the implementation standpoint, it is desirable to derive a trellis shaping scheme that uses one trellis shaper and requires one stored constellation.

SUMMARY OF THE INVENTION

It is an objective of the present invention to provide methods and apparatuses for trellis shaping that decrease the complexity of the trellis shaper by the number of subchannels.

It is another objective of the present invention to provide methods and apparatuses for trellis shaping that decrease delay in trellis shaping by an order of magnitude when compared to applying separate trellis shapers to each subchannel.

It is yet another objective of the present invention to provide methods and apparatuses for trellis shaping that require significantly less memory.

It is still another objective of the present invention to provide methods and apparatuses for trellis shaping that accommodate variable numbers of bits per subchannel and allow for variable amounts of transmit power per subchannel.

It is still another objective of the present invention to provide methods and apparatuses for trellis shaping that improve shaping gain when compared to shaping gain achieved when trellis shaping is applied separately to each subchannel.

The present invention presents a method of trellis shaping "down-the-block". A single trellis shaper is used by varying the position of the bit sent to the coset representative generator from tone to tone according to the information stored in the bit allocation table. The index i in FIG. 4 now signifies the subcarrier as well as variation of the time period. When the shaper is used with embedded constellations, a single constellation is stored in memory according to the original embedded labeling scheme and the alternative labeling scheme that provides better shaping performance is enforced by using the following algorithm for mapping labels to points. Given a $b_i$-bit label $[d^{b_i-1}, d^{b_i-2}, d^{b_i-3}, \ldots, d^1, d^0]$ first check to see whether or not $b_i \leq 4$. If so, then the constellation point X is looked up in the normal way:

$$X=f_0[d^{b_i-1}, d^{b_i-2}, d^{b_i-3}, \ldots, d^1, d^0]$$

where $f_0[]$ denotes the mapping operation. On the other hand, if $b_i>4$, then the mapping is performed based on the values of the region specifier bits as follows:

$$d^{b_i-1} d^{b_i-2}=00 \rightarrow X=f_0[d^{b_i-1}, d^{b_i-2}, d^{b_i-3} \ldots, d^2, d^1, d^0]$$

$$d^{b_i-1} d^{b_i-2}=01 \rightarrow X=f_0[\bar{d}^{b_i-1}, \bar{d}^{b_i-2}, d^{b_i-3}, \ldots, d^2, d^1, d^0]$$

$$d^{b_i-1} d^{b_i-2}=10 \rightarrow X=f_0[\bar{d}^{b_i-1}, \bar{d}^{b_i-2}, \bar{d}^{b_i-3}, \ldots, \bar{d}^2, d^1, d^0]$$

$$d^{b_i-1} d^{b_i-2}=11 \rightarrow X=f_0[d^{b_i-1}, d^{b_i-2}, \bar{d}^{b_i-3}, \ldots, \bar{d}^2, d^1, d^0]$$

where $\bar{d}$ is the binary complement of d.

In the receiver, the decoded constellation point's label is first retrieved, and the following algorithm is used to modify the initial label to obtain the unshaped label transmitted. Given the $b_i$-bit label $[c^{b_i-1}, c^{b_i-2}, \ldots, c^2, c^1, c^0]$, first check to see whether or not $b_i \geq 4$. If so, then no modification is required. On the other hand, if $b_i>4$, then the mapping is performed based on the values of the two most-significant bits as follows:

$c^{b_i-1} c^{b_i-2}=00 \rightarrow c^{b_i-1}, c^{b_i-2}, c^{b_i-3} \ldots, c^2, c^1, c^0$ $c^{b_i-1} c^{b_i-2}=01 \rightarrow \overline{c}^{b_i-1}, \overline{c}^{b_i-2}, \overline{c}^{b_i-3}, \ldots, \overline{c}^2, c^1, c^0$ $c^{b_i-1} c^{b_i-2}=10 \rightarrow \overline{c}^{b_i-1}, \overline{c}^{b_i-2}, c^{b_i-3}, \ldots, c^2, c^1, c^0$ $c^{b_i-1} c^{b_i-2}=11 \rightarrow c^{b_i-1}, c^{b_i-2}, \overline{c}^{b_i-3}, \ldots, \overline{c}^2, c^1, c^0$ One of the consequences of performing shaping down the block is that an appropriate weighing must be given to the metrics in the Viterbi algorithm according to the power allocated to each tone. This is in contrast to the case in which a separate trellis shaper is applied to each tone since for that implementation the transmit sequence is optimized on a subchannel by subchannel basis, and the sequence of points selected is independent of the power distribution. The solution in the case of shaping down the block is to scale the points by the constants stored in the power allocation table before computing the metrics for the Viterbi algorithm; alternatively, the metrics may be scaled by the squared magnitudes of the entries in the power allocation table. In this manner, the trellis shaper will perform a search for the lower energy sequence on candidate sequences of properly scaled points. It can be shown that the performance of shaping down the block is theoretically better than shaping on a tone by tone basis.

With an algorithmic encoder, the performance of the trellis shaper depends somewhat upon the shape and labeling scheme of the underlying 2D constellations. Here, an embodiment of an algorithmic encoder that generates square and cross constellations with labeling schemes that work fairly well with the four-state shaper is presented. The present invention is not limited to a particular type of underlying constellation. Other embodiments of the algorithmic encoder could be used as well.

The input to the algorithmic encoder is a $b_i$-bit label designated as $[d^{b_i-1}, d^{b_i-2}, d^{b_i-3} \ldots, d^2, d^1, d^0]$. In the case where $b_i$ is even, the initial step is to extract the coset bits, $(d^1, d^0)$, and the region specifier bits, $(d^{b_i-1}, d^{b_i-2})$ for the $b_i$-bit label, where it is understood that $d^{b_i-1}=0$ and $d^{b_i-2}=0$ if $b_i=2$. If $b_i>4$, the remaining $b_i-4$ bits are separated into two $(b_i-4)/2$-bit quantities, ixi and ixq, where ixi equals $[d^{b_i/2-1}, \ldots, d^2]$ and ixq equals $[d^{b_i-3} \ldots, d^{b_i/2}]$. These two points are used to determine a point $(\tilde{x}, \tilde{y})$, where $(\tilde{x}, \tilde{y})$ equals (ixi+0.5, ixq+0.5) in the first quadrant, where ixi and ixq are interpreted as positive integers in two's complement form. If $b_i \leq 4$, $(\tilde{x}, \tilde{y})$ equals (0.5, 0.5) by default. Next, the region bits are used to determine whether or not to subtract $2^{(b_i/2)-1}$ from each coordinate. Specifically, a new 2D point $(\hat{x}, \hat{y})$ is determined from $(\tilde{x}, \tilde{y})$ as follows:

$\hat{x} = \tilde{x}$ for $d^{b_i-1} = 0$ $\hat{x} = \tilde{x} - 2^{(b_i/2)-1}$ for $d^{b_i-1} = 1$ $\hat{y} = \tilde{y}$ for $d^{b_i-2} = 0$ $\hat{y} = \tilde{y} - 2^{(b_i/2)-1}$ for $d^{b_i-2} = 1$ Finally, the point (x,y) to be transmitted is obtained by rotating $(\hat{x}, \hat{y})$ to the proper coset according to the coset bits $(d^1, d^0)$. The decoding operation is easily derived by reversing the operations of the encoder.

For the case where $b_i$ is odd, as in the previous case, the coset bits $(d^1, d^0)$ are extracted, leaving a remaining label of $[d^{b_i-1}, d^{b_i-2}, \ldots, d^2]$. Next, the bit $d^{b_i-1}$ is used to determine whether or not one of the coordinates is "outer" as is typically done in the generation of cross constellations. If $d^{b_i-1}$ equals 1, then an outer point is used and the $(b_i-3)/2$-bit quantity, ixi, is formed and set to $[d^{(b_i+1)/2}, \ldots, d^3]$, and the $(b_i-1)/2$-bit quantity, ixq, is formed and set to $[1, 0, d^{b_i-2}, \ldots, d^{(b_i+3)/2}]$. Furthermore, ixi and ixq are interchanged if $d^2$ equals 1.

On the other hand, when $d^{b_i-1}$ equals 0, both coordinates are "inner". In this case, the two $(b_i-3)/2$-bit quantities, ixi and ixq, are set to $[d^{b_i-3}, d^{b_i-5}, \ldots, d^2]$ and $[d^{b_i-2}, d^{b_i-4}, \ldots, d^3]$ respectively. Furthermore, if $d^{b_i-2}$ equals 1, then ixi and ixq are modified by inverting the rest of the bits to set ixi and ixq to $[\overline{d}^{b_i-3}, \overline{d}^{b_i-5}, \ldots, \overline{d}^2]$ and $[d^{b_i-2}, \overline{d}^{b_i-4}, \ldots, \overline{d}^3]$, respectively.

The final points are obtained by setting the quantity $(\hat{x}, \hat{y})$ to (ixi+0.5, ixq+0.5), where ixi and ixq are interpreted as positive integers, and rotating the point to the proper coset according to $(d^1, d^0)$ to obtain (x, y).

Note that the present invention can be applied to all multi-carrier transmission system.

An advantage of the present invention is that it provides methods and apparatuses for trellis shaping that decrease the complexity of the trellis shaper by the number of subchannels.

Another advantage of the present invention is that it provides methods and apparatuses for trellis shaping that decrease delay in trellis shaping by an order of magnitude when compared to applying separate trellis shapers to each subchannel.

Still another advantage of the present invention is that it provides methods and apparatuses for trellis shaping that require significantly less memory.

Yet still another advantage of the present invention is that it provides methods and apparatuses for trellis shaping that accommodate variable numbers of bits per subchannel and allow for variable amounts of transmit power per subchannel.

Another advantage of the present invention is that it provides methods and apparatuses for trellis shaping that improve shaping gain when compared to shaping gain achieved when trellis shaping is applied separately to each subchannel.

These and other objects and advantages of the present invention will no doubt become apparent to those skilled in the art after having read the following detailed description of the preferred embodiment which is illustrated in the several figures of the drawing.

IN THE DRAWINGS

FIG. 5 illustrates the performance of a 4-state trellis shaping code as a function of constellation size.

FIG. 17 is a block diagram of a multi-channel decoder of the present invention.

FIG. 18 illustrates an embodiment of the multi-channel inverse trellis shaper.

FIG. 19 illustrates one possible inverse coset representative generator.

DETAILED DESCRIPTION OF THE PREFERRED EMBODIMENTS

Figure 1:
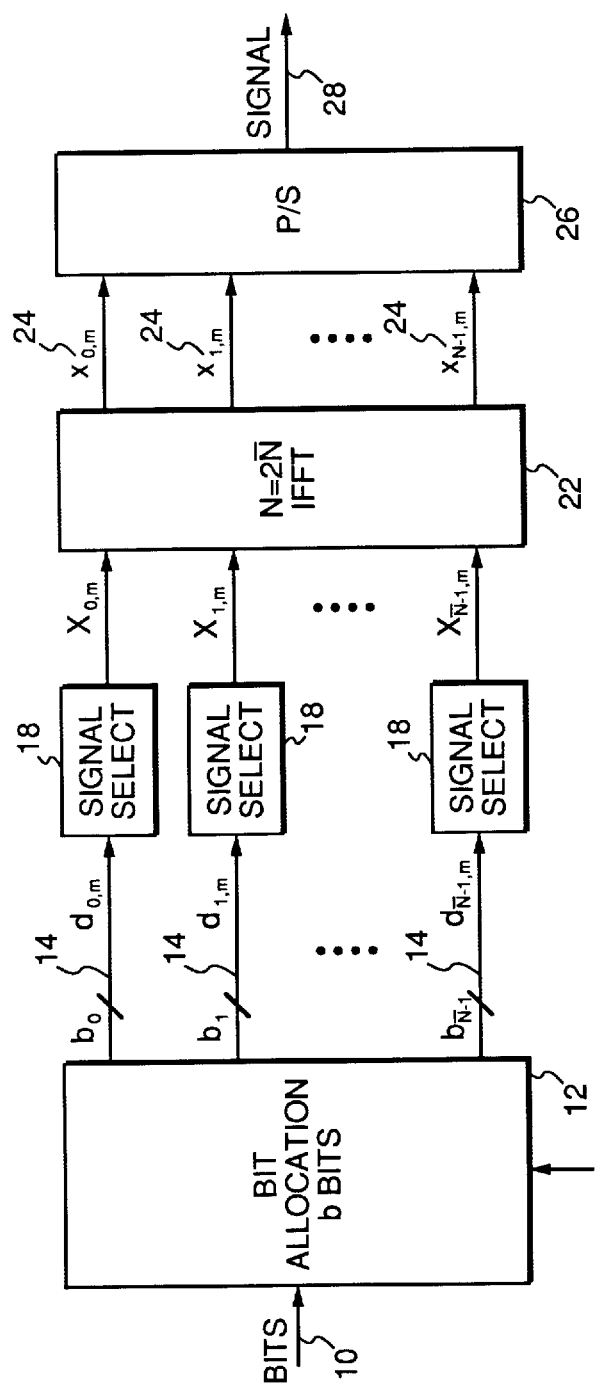
FIG. 1 illustrates a simplified transmitter for a discrete multitone modulation system.
Figure 3:
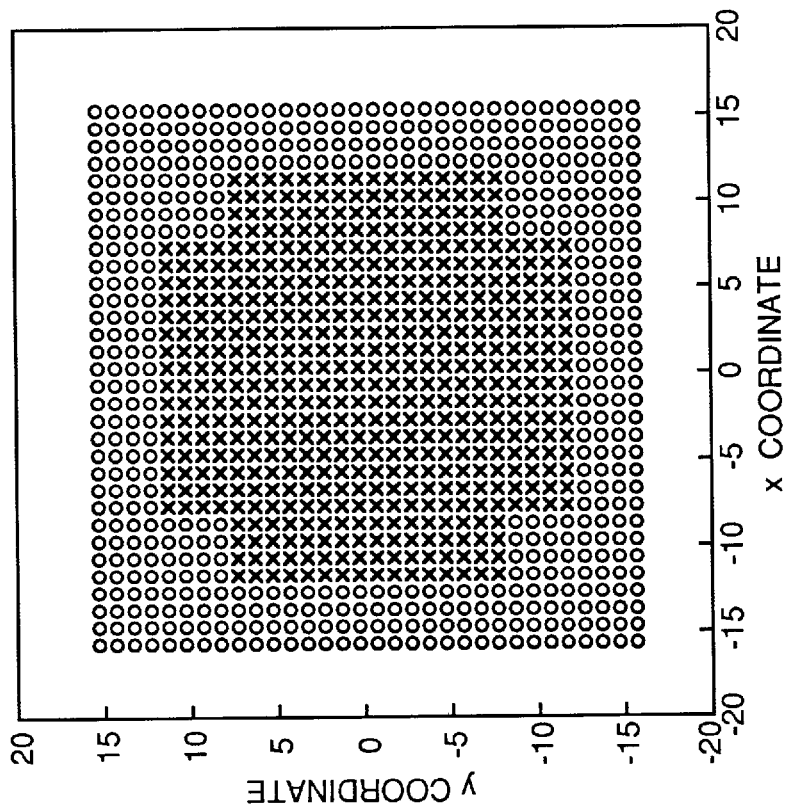
FIG. 3 shows a 512-point cross constellation and a 1024-point square constellation.
Figure 2:
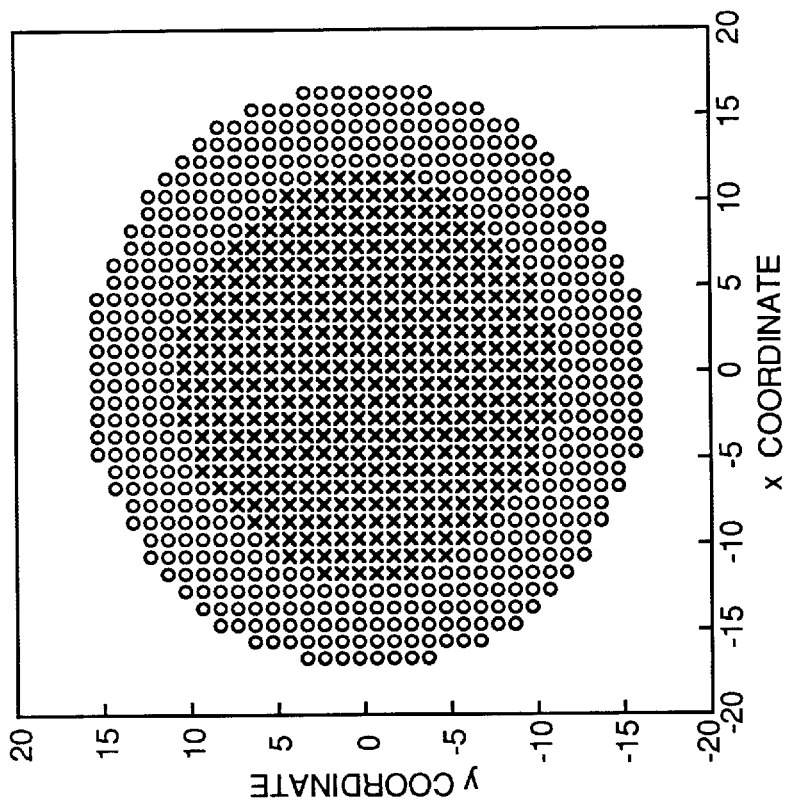
FIG. 2 shows a 512-point circular constellation embedded in a 1024-point circular constellation.
Figure 4:
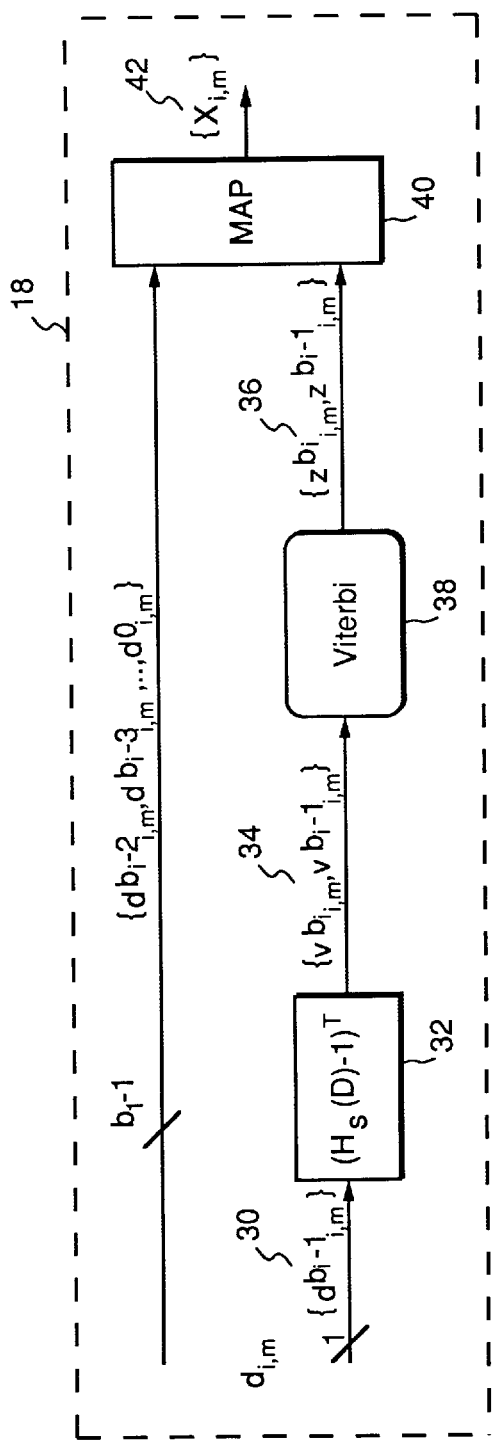
FIG. 4 illustrates a 4-state, two dimensional (2D) trellis shaper for the $i^{th}$ subchannel.
Figure 5A:
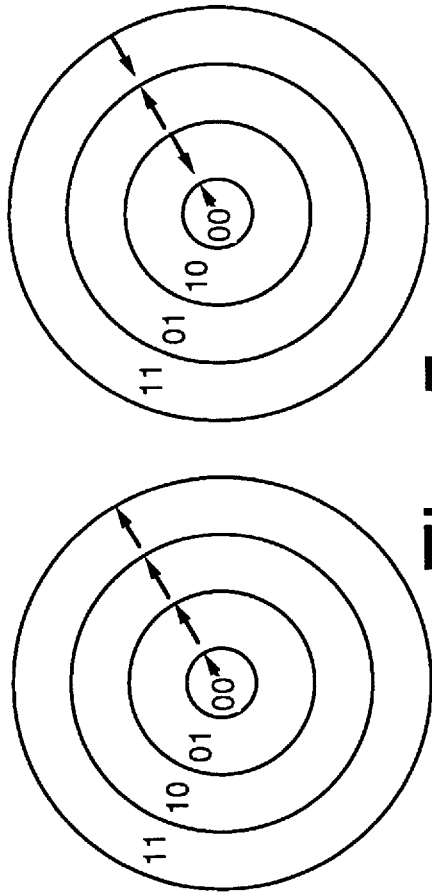
FIG. 5A shows a comparison of standard and modified labeling schemes for embedded circular constellation.
Figure 6:
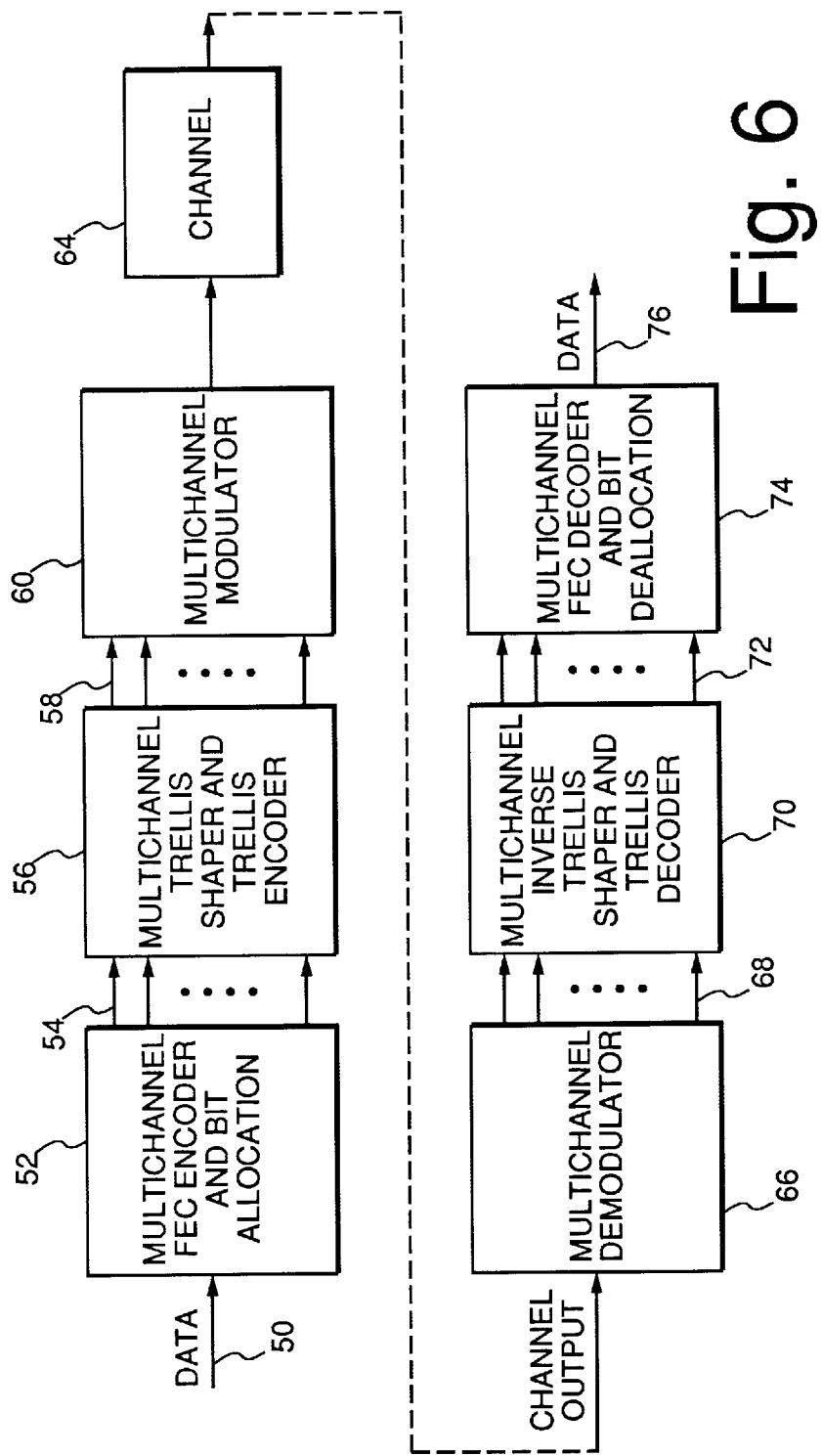
FIG. 6 shows the system overview of a discrete multitone system containing an embodiment of the present invention.

FIG. 6 illustrates a system overview of a multi-channel system, where data 50 is first forward-error-correction (FEC) encoded 52 and allocated to the subchannels according to the transmission quality of each respective subchannel. The encoded information for each subchannel 54 is then trellis encoded and trellis shaped to produce the constellation point 58 that determines the amplitude and phase of the subcarrier. The multi-channel modulator 60 modulates the subcarriers with the constellation points to form the signal that is transmitted through a medium 64, which can be a cable, free space, a digital subscriber line, or other types of media.

On the receiving end, the multi-channel demodulator 66 demodulates the received subcarriers and generates an output point 68 from the signal. The output point passes through the trellis decoder and the inverse trellis shaper 70 to produce predecoded information 72. The predecoded information is further decoded by the FEC decoder 74 to obtain the original data 76. Note that other encoding methods although not illustrated may be employed in a multi-channel system. Furthermore, although a trellis encoder is shown, it is not essential to the present invention. The present invention is directed to a method for trellis shaping of bit streams in a multi-channel system.

Figure 7:
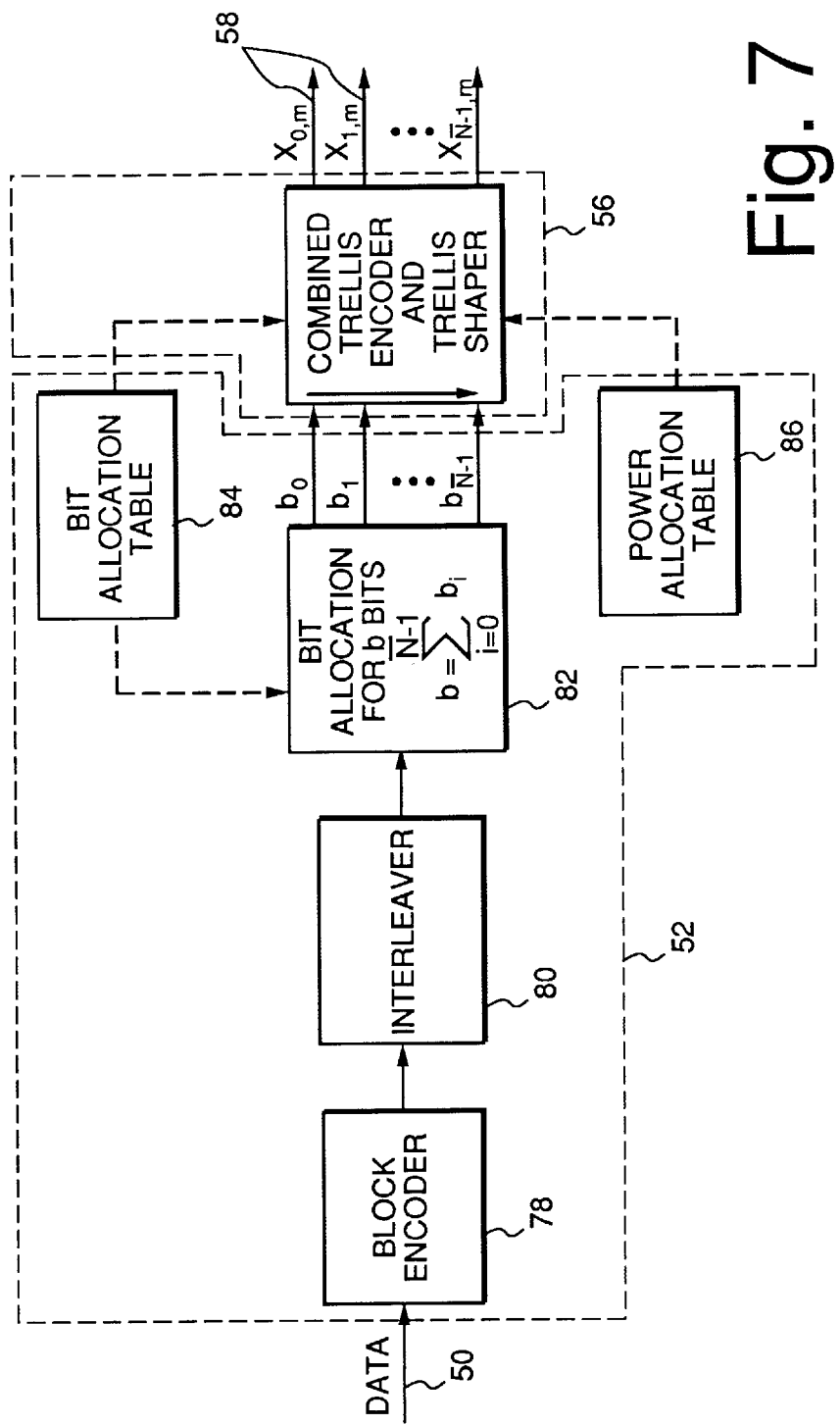
FIG. 7 is a detailed illustration of the multi-channel encoder of an embodiment of the present invention.

As illustrated by FIG. 7, the multi-channel FEC encoder 52 block encodes the data 50 to produce block encoded data, and the interleaver 80 interleaves the block encoded data to produce interleaved block encoded data. This data is then allocated to the subcarriers 82 where a subcarrier i is allocated $b_i$ bits according to a bit allocation table 84, which stores the number of bits per symbol for each respective carrier. The number of bits allocated to a subcarrier is a function of the signal-to-noise ratio of that subcarrier determined at initialization of the transmission process. The bits for a subcarrier are passed to the trellis encoder and trellis shaper 56 which generates a point 58 that is used to modulate a subcarrier. The power allocated to a subcarrier is determined at initialization and stored in a power allocation table 86.

Figure 8:
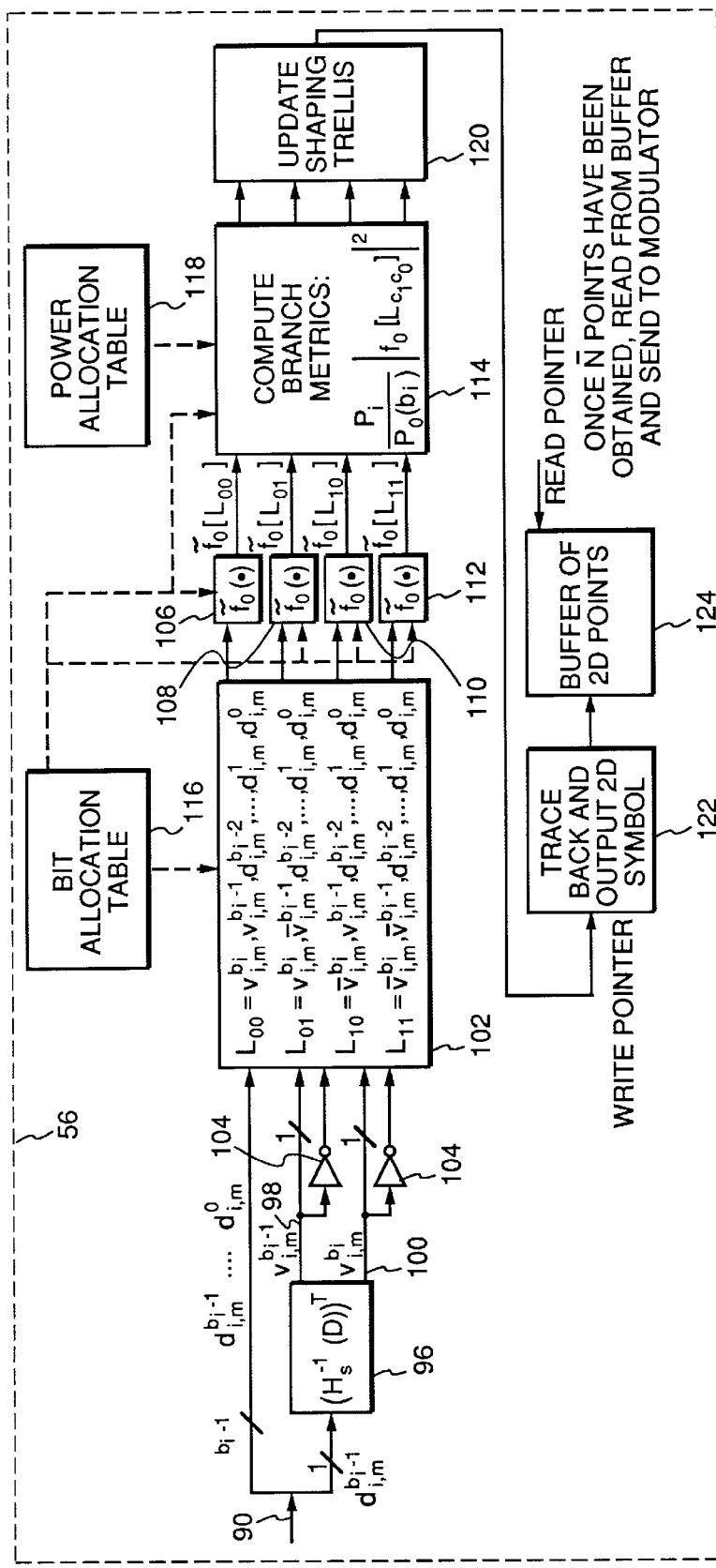
FIG. 8 is an illustration of an embodiment of the present invention, a multi-channel trellis shaper.

FIG. 8 provides a detailed overview of an embodiment of the present invention, namely a trellis shaper. Note that instead of having a trellis shaper for each subcarrier as in the prior art the present invention uses one trellis shaper for all of the subcarriers. Further note the following symbols and the corresponding definitions used:

$\overline{N}$: the number of subchannels;

i: subchannel index, ranging from 0 to $\overline{N}$-1;

m: block index, ranging from 0 to ∞;

$b_i$: number of bits allocated to the $i^{th}$ subchannel;

$d_{i,m}$: unshaped constellation label assigned to the $i^{th}$ subchannel during block period m;

$d_{i,m}^1$: $1^{st}$ bit of the constellation label $d_{i,m}$; bits are labeled from 0 to $b_i$-1, where 0 corresponds to the least-significant bit (LSB) and $b_i$-1 corresponds to the most-significant bit (MSB);

$P_i$: amount of power allocated to the $i^{th}$ subchannel;

$\tilde{f}_0(\bullet)$: a mapping operation that maps unique constellation labels into unique 2D points on a grid;

$P_0(b_i)$: The 2D symbol power of a $2^{b_i}$-point constellation based on the mapping operation $\tilde{f}_0(\bullet)$. In other words:

$$P_0(b_i) = \frac{1}{2^{b_i}} \sum_{k=0}^{2^{b_i}-1} |\tilde{f}_0(k)|^2$$

We use k as both an index of the summation as well as a constellation label. In the latter case, the constellation label is the unsigned binary representation of the integer k.

The input or label 90 to the trellis shaper $[d_{i,m}^{b_i-1} \ldots d_{i,m}^0]$, is composed of $b_i$ bits. The most significant bit of the input, $d_{i,m}^{b_i-1}$, passes through a coset representative generator matrix 96 to form an initial sequence of region specifier bits $v_{i,m}^{b_i}$ 100 and $v_{i,m}^{b_i-1}$ 98. The region specifier bits and/or complements thereof 104 are combined with the other bits of the input $[d_{i,m}^{b_i-2} \ldots d_{i,m}^0]$ to form the constellation labels 102, $L_{00}$, $L_{01}$, $L_{10}$, and $L_{11}$ 102. Each of the constellation labels is then mapped to a unique 2D point on a grid 106-112, and the 2D symbol power of the 2D point is computed 114 and assigned to the branch metrics for the state diagram of an x-state encoder. Here, a 4-state encoder is used.

After the branch metrics are computed, the shaping trellis is updated 120 to include the new branch metrics, and the trace back operation of the Viterbi algorithm is performed 122 to generate the corresponding 2D symbol. The symbol is stored in a buffer 124 for reading and writing purposes.

Figure 9:
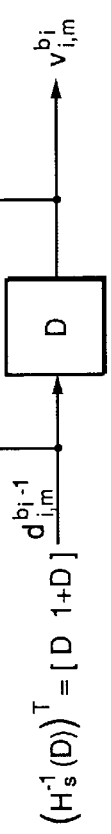
FIG. 9 is an illustration of a coset representative generator.
Figure 10:
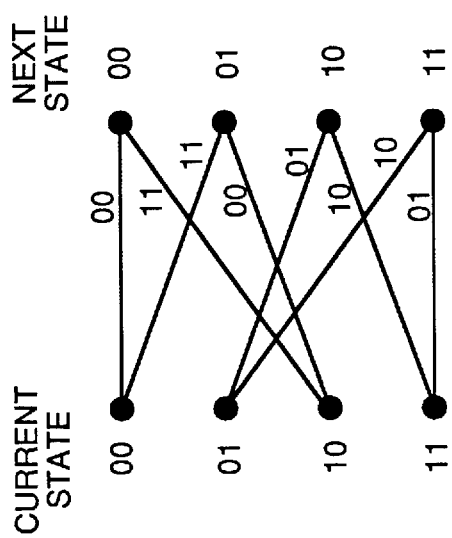
FIG. 10 is an example of a state diagram for a 4-state encoder.

FIG. 9 illustrates the configuration of a coset representative generator 96 used in FIG. 8. The trellis diagram shown in FIG. 10 that corresponds to the generator matrix $G_s(D)$ whose parity check matrix is $H_s(D)$ is a 4-state, two dimensional diagram with branch labels 00, 01, 10, and 11. Note that this is a specific example of a coset representative generator and a trellis diagram. The present invention may be applied to other embodiments as well.

Figure 11:
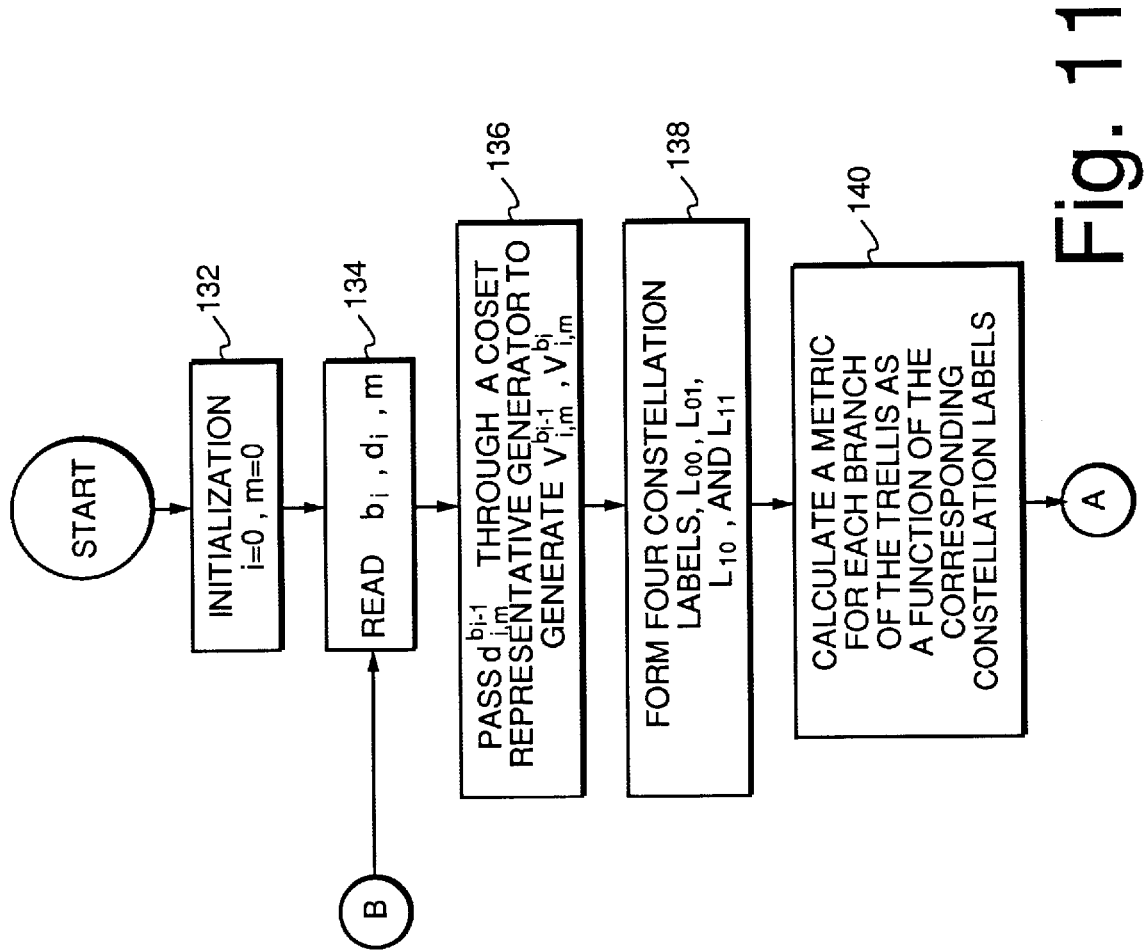
FIGS. 11–12 is a flowchart illustrating the functional steps of the present invention which is a multi-channel trellis shaper.

Referring to FIG. 11, a flow chart illustrates the trellis shaping steps of an embodiment of the present invention. In the initialization step 132, the subcarrier index, i, and the block index, m, are set to zero. After initialization, the number of bits for the $i^{th}$ subcarrier, $b_i$, and the bits represented as $[d_{i,m}^{b_i-1} \ldots d_{i,m}^0]$, are read. Note that the number of bits to be read for a subcarrier is stored in the bit allocation table.

The most significant bit (MSB), $d_{i,m}^{b_i-1}$, is applied to the input of a coset representative generator defined by $(H_s(D)^{-1})^T$ to generate two region specifier bits $v_{i,m}^{b_i}$ and $v_{i,m}^{b_i-1}$ 136. With these two region specifier bits, four constellation labels are formed as follows 138:

$$L_{00} = v_{i,m}^{b_i}, v_{i,m}^{b_i-1}, d_{i,m}^{b_i-2}, \ldots, d_{i,m}^{1}, d_{i,m}^{0}$$

$$L_{01} = v_{i,m}^{b_i}, v_{i,m}^{b_i-1} \oplus 1, d_{i,m}^{b_i-2}, \ldots, d_{i,m}^{1}, d_{i,m}^{0}$$

$$L_{10} = v_{i,m}^{b_i} \oplus 1, v_{i,m}^{b_i-1}, d_{i,m}^{b_i-2}, \ldots, d_{i,m}^{1}, d_{i,m}^{0}$$

$$L_{11} = v_{i,m}^{b_i} \oplus 1, v_{i,m}^{b_i-1} \oplus 1, d_{i,m}^{b_i-2}, \ldots, d_{i,m}^{1}, d_{i,m}^{0}$$

where $\oplus$ denotes the exclusive-or operation, and when performed with a binary "1" it is equivalent to the binary complement. The metrics for the branches of the trellis diagram are calculated as a function of the constellation labels and the power assigned to the subcarrier as follows 140:

$$\frac{P_i}{P_0(b_i)} |\tilde{f}_0^{L_{c_1 c_0}}|^2 \qquad \text{(equ. 2)}$$

Either the constellation labels $L_{c_1 c_0}$ or the corresponding constellation points $\tilde{f}_0[L_{c_1 c_0}]$ associated with the branches are stored.

Figure 12:
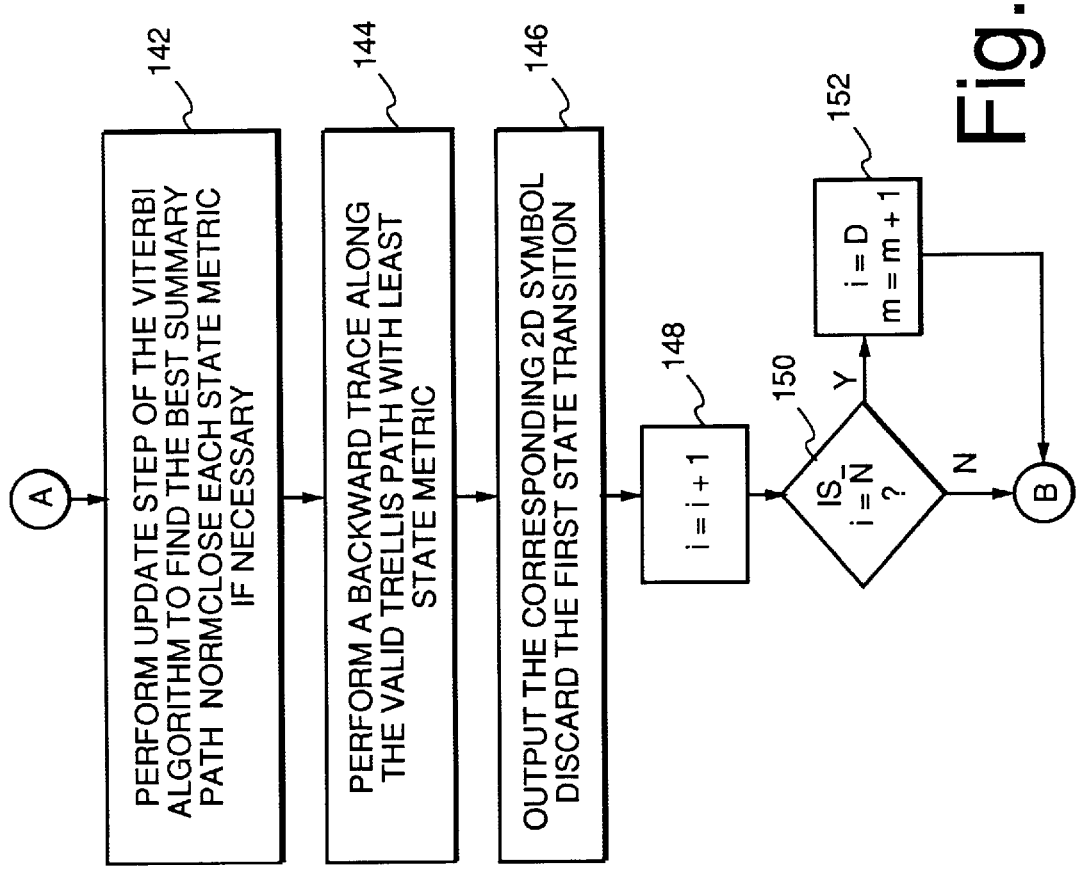

Referring to FIG. 12, with the metrics for the trellis branches calculated, the update step of the well-known Viterbi algorithm is performed to find the best survivor path into each of the four output states (as previously illustrated in FIG. 10) 142. The metrics used in the Viterbi algorithm are the metrics calculated above by equation 2 and the criteria for the Viterbi algorithm is to minimize the sum of the branch metrics on each survivor path terminating at the four output states. If necessary, each state metric is normalized by summing the branch metrics on the survivor path terminating in the corresponding state and subtracting a constant. After calculating the state metrics, a backward trace along the valid trellis path with the least state metric is performed 144. Note that it is important that a valid, continuous trellis path is maintained; some implementations of the Viterbi algorithm do not ensure such path. The length of the backward trace is a constant that should be sufficiently large to enable near optimum performance of the algorithm. The 2D symbol corresponding to the first state transition on the valid path with the least state metric is produced 146. This is the end of processing for the $i^{th}$ subcarrier for block m. In the next loop, by incrementing i 148, the information to be carried by the next subcarrier is processed. In this manner, all the information for all the subcarriers are processed for block period m 150. The next block period, m+1, is processed 152 subsequently until all data are processed. Note that connector B of FIG. 12 returns to connector B of FIG. 11 after the subcarrier index i, and/or the block period, m, have been changed. Note that it is not necessary to shape the tones in ascending order. The tones may be sorted in a predetermined order according to certain desired criteria and then shaped.

Constellation Mapper

To reduce memory requirement in multi-channel applications, the various constellation sizes required for each subcarrier can be supported by one of two methods. The first method is an embedded constellation scheme where a large constellation is stored in memory and an embedded labeling scheme is used to access the smaller constellations which are subsets of the stored larger constellation. The second method is an algorithmic encoder used to generate constellation points algorithmically from the given constellation labels. Although there are many constellation mapping methods, these methods do not necessarily work well with the multi-channel trellis shaper. In the preferred embodiment, the following two mapping methods optimize gain for the 4-state multi-channel trellis shaper described above.

Embedded Constellation

A large constellation is stored in memory with an embedded labeling scheme that is generated by ordering points on the half-integer 2D grid, $Z^2+(0.5, 0.5)$, according to increasing energy level and assigning larger labels interpreted as unsigned integers to points with higher energy. Note that $Z^2$ denotes the infinite set of pairs of integers. The operation of mapping labels to points on the embedded constellation is signified by $f_0(\bullet)$. This is simply a table lookup operation. Given a constellation label, $[d^{b_i-1}, d^{b_i-2}, d^{b_i-3}, \ldots, d^2, d^1, d^0]$, the mapping operation $\tilde{f}_0(\bullet)$ that is used with the multi-channel trellis shaper to obtain a constellation point X is described by FIG. 13.

Figure 13:
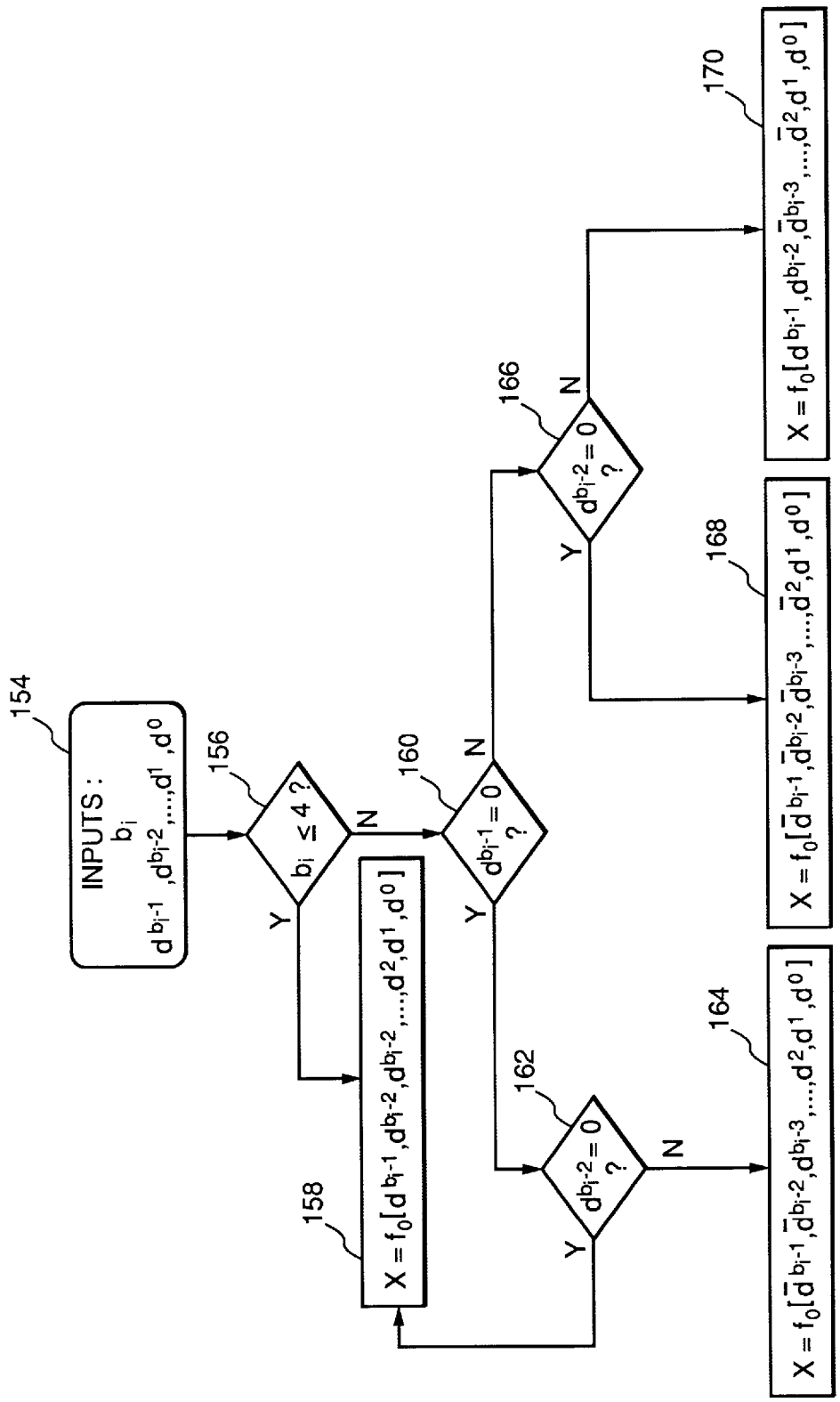
FIG. 13 illustrates the flowchart of a multi-channel constellation mapper for embedded constellations to work with the present invention.

Referring to FIG. 13, the number of bits, $b_i$, and the constellation label $[d^{b_i-1}, d^{b_i-2}, d^{b_i-3} \ldots, d^2, d^1, d^0]$ are read 154. If the number of bits, $b_i$, is less than or equal to 4, X equals to a straight mapping of the inputted constellation label 158. If the most significant bit of the constellation label, $d^{b_i-1}$, equals 0 160 and $d^{b_i-2}$ equals 0 162, X is set to a mapping of the inputted constellation label. If $d^{b_i-1}$ equals 0 and $d^{b_i-2}$ equals 1, X is set to a mapping of $[\overline{d}^{b_i-1}, \overline{d}^{b_i-2}, d^{b_i-3}, \ldots, d^2, d^1, d^0]$ 164. If $d^{b_i-1}$ equals 1 and $d^{b_i-2}$ equals 0 166, X is set to a mapping of $[\overline{d}^{b_i-1}, \overline{d}^{b_i-2}, \overline{d}^{b_i-3}, \ldots, \overline{d}^2, d^1, d^0]$ 168. For the last case where $d^{b_i-1}$ and $d^{b_i-2}$ both equal 1, X is set to a mapping of $[d^{b_i-1}, d^{b_i-2}, \overline{d}^{b_i-3}, \ldots, \overline{d}^2, d^1, d^0]$ 170.

Algorithmic Mapping Encoder

The algorithm encoder reads the constellation label and the number of bits in the constellation label to generate a 2D point X, where X equals (x,y).

Figure 14:
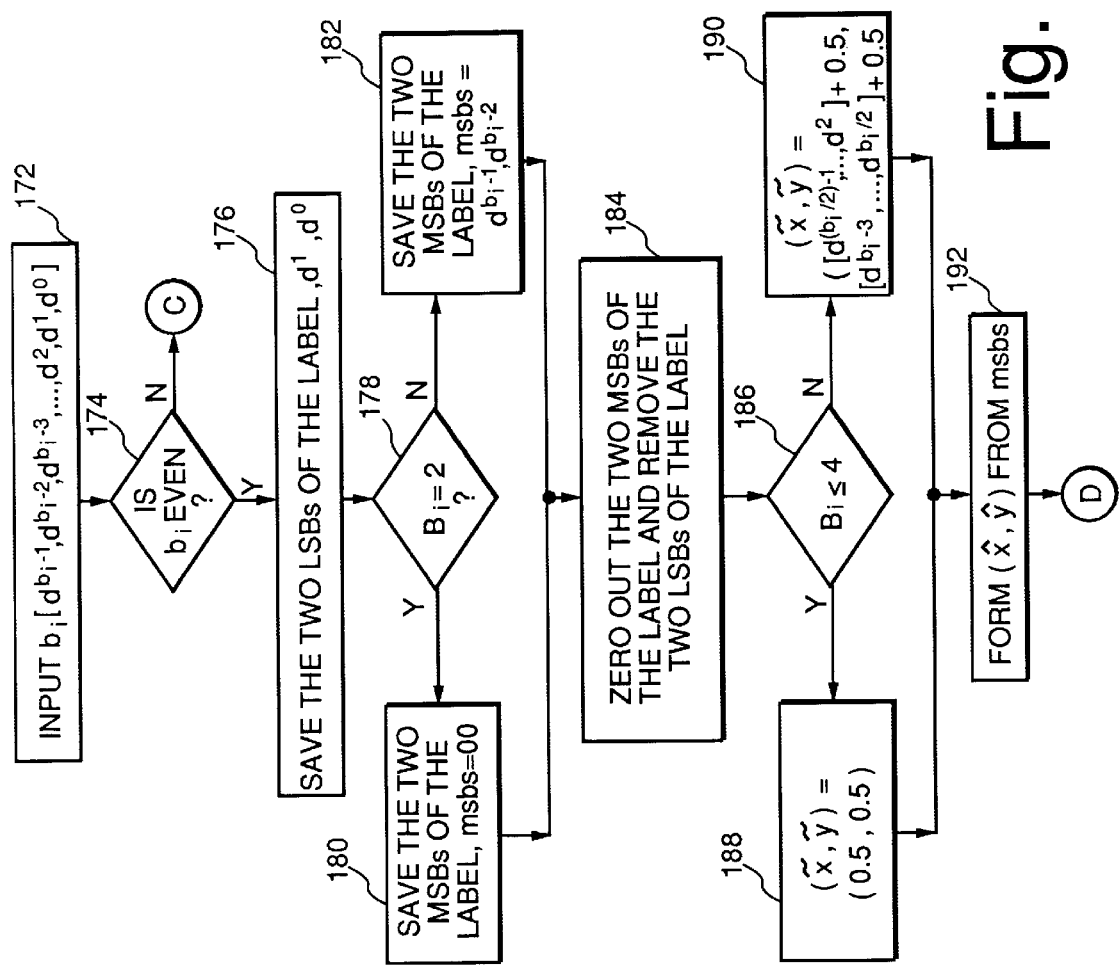
FIGS. 14–16 is a flowchart illustrating the functional steps of an algorithmic encoder for multi-channel constellation mapping.

Referring to FIG. 14, the constellation label and $b_i$ are inputted 172. If $b_i$ is odd 174, the program flow branches to connector C of FIG. 15. If $b_i$ is even, the two least significant bits (LSBs) are saved by setting the variable lsbs to $d^1 d^0$ 176. After the two LSBs are saved, the two most significant bits are saved in the variable msbs. Thus, if $b_i$ equals 2 178, msbs equals 00 180. Otherwise, msbs equals $d^{b_i-1} d^{b_i-2}$ 182. With the two LSBs and two MSBs of the constellation label saved, the two MSBs are zeroed out and the two LSBs are removed from the label 184, and the constellation label now equals $[d^{b_i-3}, d^{b_i-4}, \ldots, d^3, d^2]$. Note that if $b_i$ is less than or equal to 4, the label now contains all zeros. If $b_i$ is less than or equal to 4, the first intermediate point $(\tilde{x}, \tilde{y})$ is set to (0.5 0.5) 188. Otherwise, $(\tilde{x}, \tilde{y})$ is set to ( $[d^{b_i/2-1}, \ldots, d^2]+0.5$, $[d^{b_i-3}, \ldots, d^{b_i/2}]+0.5$) 190.

Figure 16:
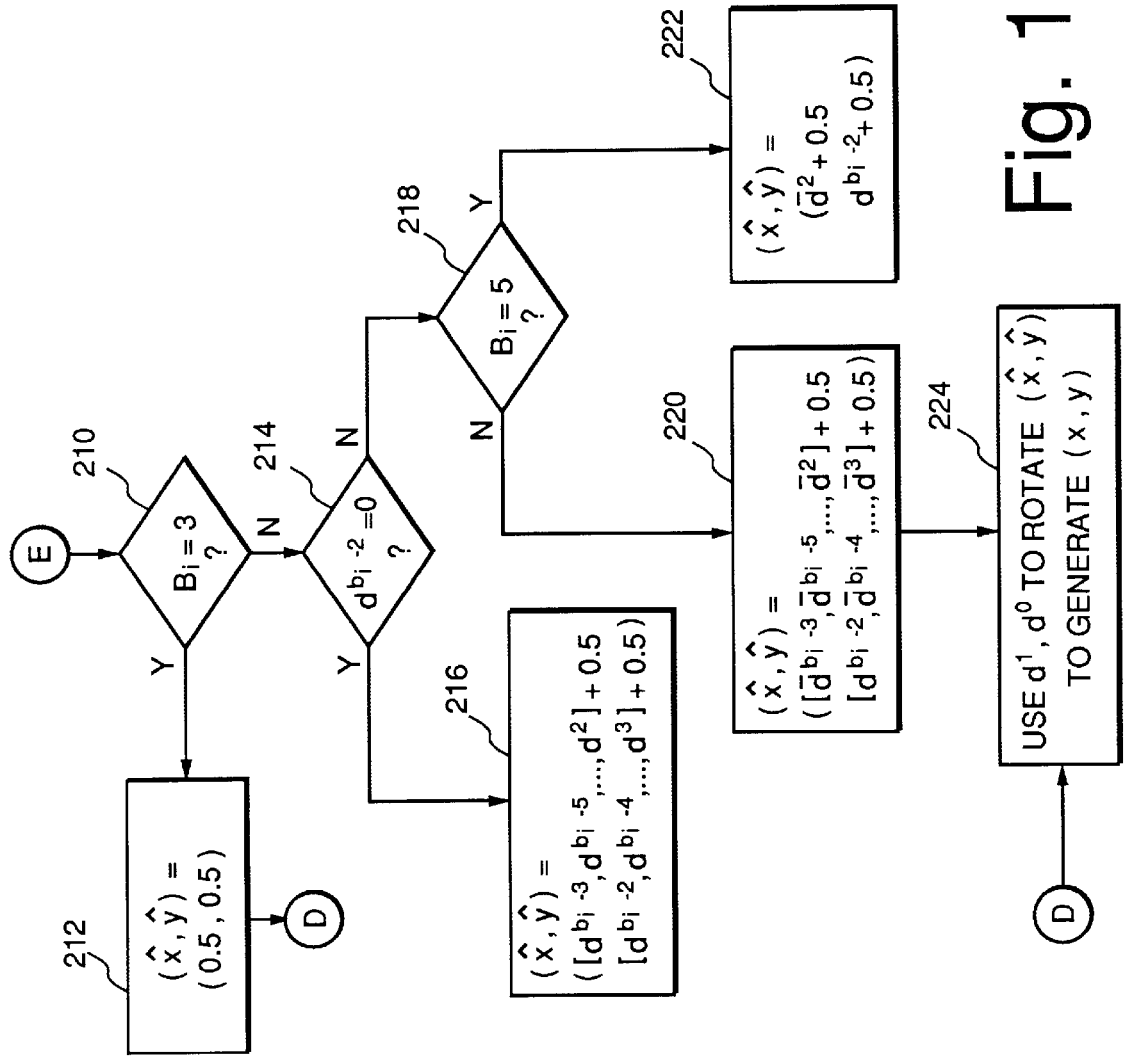

The next step is to generate the second intermediate point $(\hat{x}, \hat{y})$ 192. Let msbs_1 represent the MSB of the two-bit quantity msbs, and let msbs_0 represent the LSB of the quantity msbs. The second intermediate point, $(\hat{x}, \hat{y})$ is formed as follows:

for msbs_1=0 $\hat{x}=\tilde{x}$ for msbs_1=1 $\hat{x}=\tilde{x}-2^{(b_i/2)-1}$ for msbs_0=0 $\hat{y}=\tilde{y}$ for msbs_0=1 $\hat{y}=\tilde{y}-2^{(b_i/2)-1}$ The final point (x, y), referring to connector D of FIG. 16, is obtained by rotating the second intermediate point by 0°, 90°, 180°, or 270° as indicated by $d^1, d^0$, which is stored in lsbs. The four possible combinations from $d^1$ and $d^0$ could be used to represent the four possible values of the rotation. Alternatively, it could be used to specify one of the four cosets of the lattice $2Z^2$ in $Z^2$.

Figure 15:
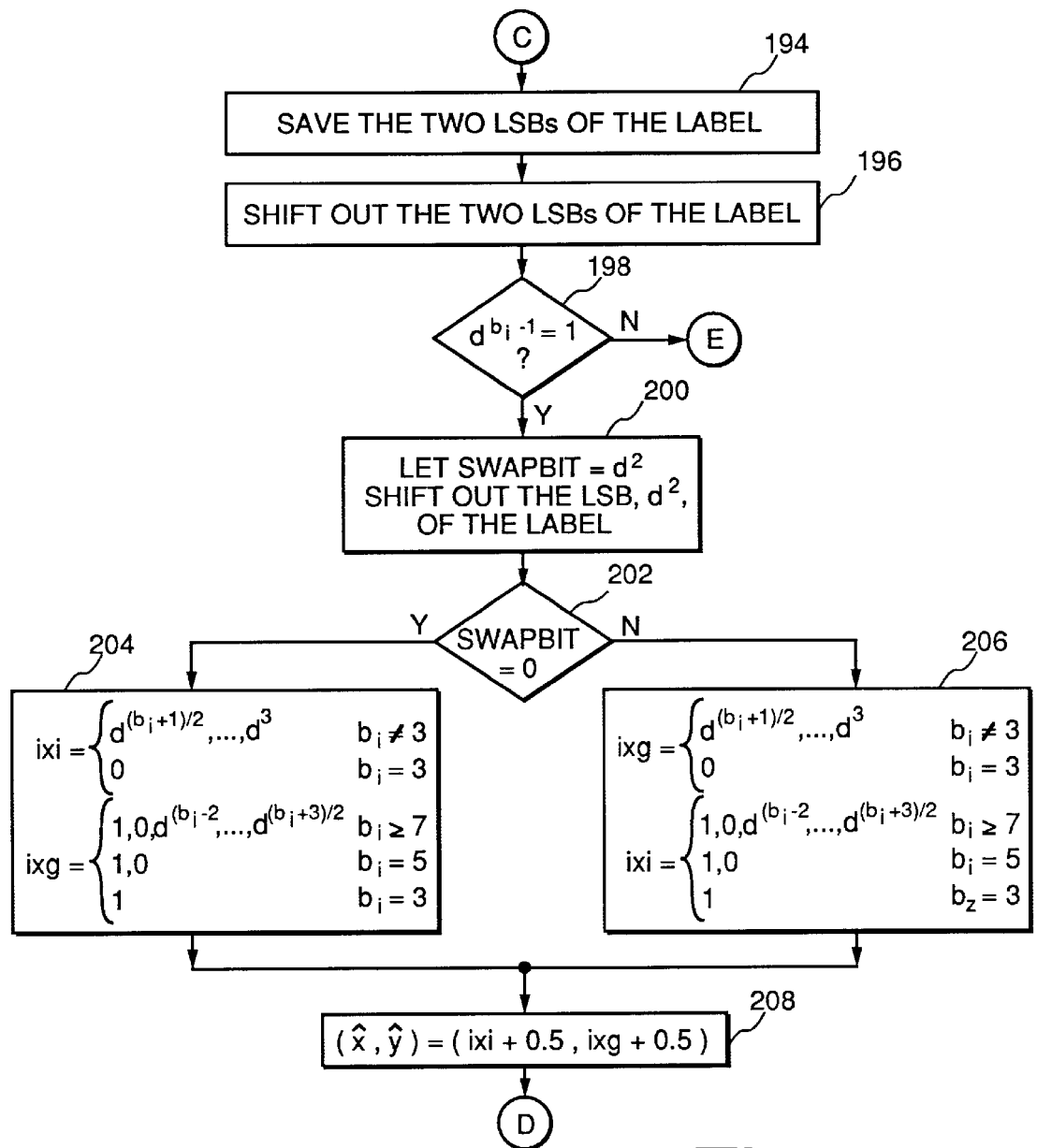

For the case where the number of bits in the constellation is odd, referring to connector C of FIG. 15, the two LSBs of the constellation label are saved by setting lsbs to $d^1$, $d^0$ 194, and removing them from the label 196. If $d_{b_i-1}$ does not equal to one 198, the program flow transfers to connector E. If $d^{b_i-1}$ equals one 198, a flag, swapbit, is set to $d^2$ 200, and the LSB, $d^2$, of the label is removed. Note that if $b_i=3$, the label would be all zeros now. If the swapbit equals 0 202, two unsigned integers, ixi and ixq are formed as follows:

* for $b_i \neq 3$    $ixi = d^{(b_i+1)/2}, \ldots, d^3$
* for $b_i = 3$    $ixi = 0$
* for $b_i \geq 7$    $ixq = 1, 0, d^{b_i-2}, \ldots, d^{(b_i+3)/2}$
* for $b_i = 5$    $ixq = 1, 0$
* for $b_i = 3$    $ixq = 1$ otherwise, swapbit equals 1 and ixi and ixq are set to:

* for $b_i \neq 3$    $ixq = d^{(b_i+1)/2}, \ldots, d^3$
* for $b_i = 3$    $ixq = 0$
* for $b_i \geq 7$    $ixi = 1, 0, d^{b_i-2}, \ldots, d^{(b_i+3)/2}$
* for $b_i = 5$    $ixi = 1, 0$
* for $b_i = 3$    $ixi = 1$ The second intermediate point $(\hat{x}, \hat{y})$ is set to (ixi+0.5, ixq+0.5). The final point, (x, y), referring to connector D of FIG. 16, is generated in the same manner as described above in the case where $b_i$ is even.

For the case where $b_i$ is odd and $d^{b_i-1}$ is not one, referring to connector E of FIG. 16, if $b_i$ equals 3 210, the second intermediate point, $(\hat{x}, \hat{y})$, is set to (0.5, 0.5) 212, and the final point is obtained by rotating $(\hat{x}, \hat{y})$ by $d^1$, $d^0$ 224. If $b_i$ does not equal to 3 210 and $d^{b_i-2}$ equals 0 214, the second intermediate point, $(\hat{x}, \hat{y})$, is set to ([ $d^{b_i-3}, d^{b_i-5}, \ldots, d^2$]+0.5, [ $d^{b_i-2}, d^{b_i-4}, \ldots, d^3$ ]+0.5) 216. If $d^{b_i-2}$ does not equal to 0 214 and $b_i$ equals 5 218, the second intermediate point, $(\hat{x}, \hat{y})$, is set to ($\bar{d}^2$+0.5, $d^{b_i-2}$+0.5) 222. Otherwise, if $b_i$ does not equal to 5 218, the second intermediate point is set to ([ $\bar{d}^{b_i-3}, \bar{d}^{b_i-5}, \ldots, \bar{d}^2$ ]+0.5, [$d_{b_i-2}, \bar{d}^{b_i-4}, \ldots, \bar{d}^3$ ]+0.5) 220. The final point, (x, y), is obtained by rotating $(\hat{x}, \hat{y})$ by $d^1$ and $d^0$ 224 as explained above.

MULTI-CHANNEL DECODER

On the receiver side, referring to FIG. 17, the modulated waveform is received by the multi-channel decoder. Each of the received points $X_{i,m}$ is inverse trellis shaped and trellis decoded 232 to extract $b_i$ bits 233 from the $i^{th}$ subcarrier in accordance with the bit allocation table 234. The bits are reassembled 236 for block m and sent to the deinterleaver 240 and the block decoder 242 to reconstruct the original message or data 244.

FIG. 18 shows a detailed illustration of the inverse trellis shaper. The noisy received constellation point $Y_{i,m}$, corresponding to the $i^{th}$ tone at the output of the multi-channel demodulator during symbol m is decoded 247 to produce $X_{i,m}$ on the grid $Z^2$+(0.5, 0.5). This decoding step might be a simple slicing operation (in the uncoded case) or a more complicated Viterbi detection (if trellis coding is applied). The point $X_{i,m}$ is mapped 246 to a constellation label [$z_{i,m}^{b_i}$, $z_{i,m}^{b_i-1}$, $d_{i,m}^{b_i-2}$, ..., $d_{i,m}^1$, $d_{i,m}^0$], and this operation is the inverse of the mapping operation of the transmitter. The two MSBs of the constellation label, $z_{i,m}^{b_i}$ and $z_{i,m}^{b_i-1}$ as indicated at 248, are sent through the circuit $H_s(D)^T$ 250 to obtain $d_{i,m}^{b_i-1}$ 252, which is combined with [$d_{i,m}^{b_i-2}, \ldots, d_{i,m}^0$] 254 to generate the decoded constellation label [$d_{i,m}^{b_i-1}, d_{i,m}^{b_i-2}, \ldots, d_{i,m}^1, d_{i,m}^0$] with $b_i$ bits 233.

An example of the circuit $H_s(D)^T$ is illustrated by FIG. 19 where $H_s(D)^T$ equals $[1+D+D^2\ 1+D^2]^T$.

Figure 20:
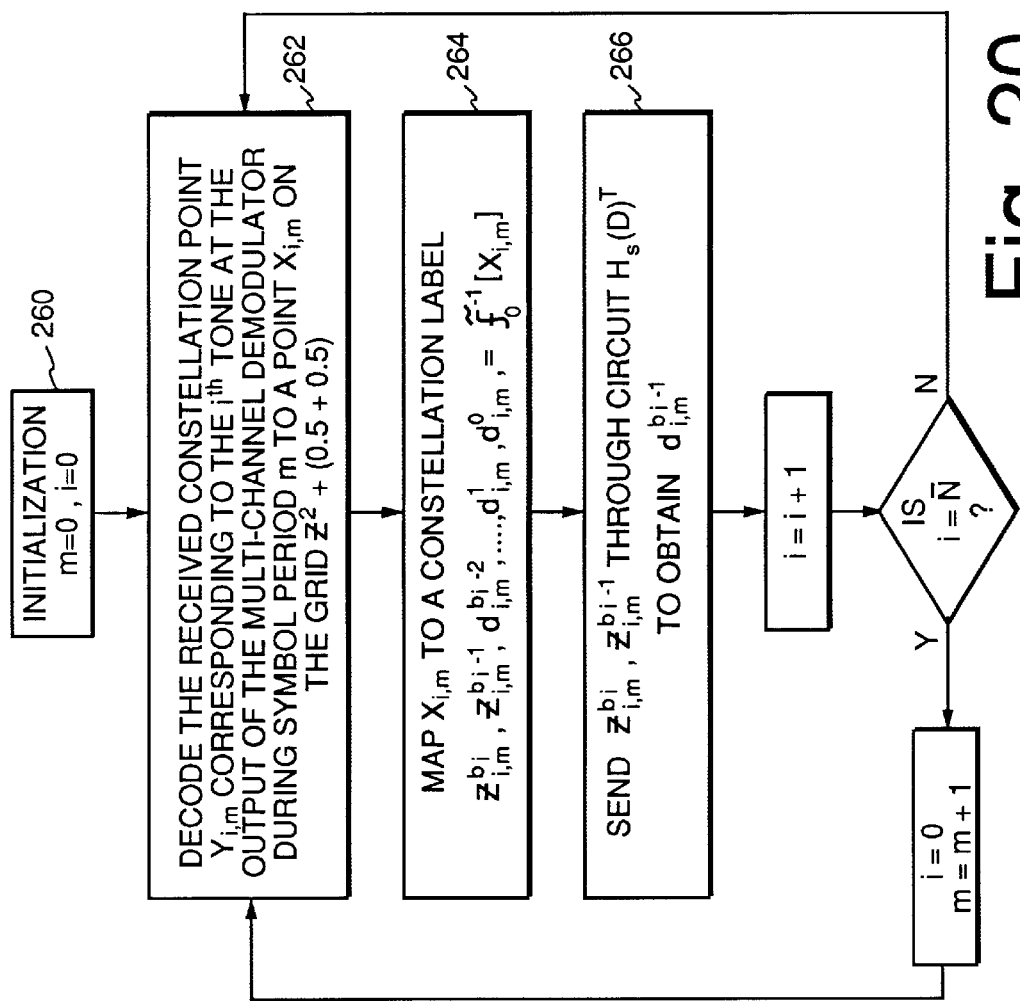
FIG. 20 is a flowchart illustrating the decoding steps to return the received constellation point to the original message.

A flow chart, referring to FIG. 20, illustrates the required decoding steps to undo the trellis shaping operation performed on the transmitter side. At first, block period variable m and channel symbol i are set to zero 260. The next gross step is to decode the received constellation point $Y_{i,m}$ corresponding to the $i^{th}$ tone of the output of the multi-channel demodulator during symbol period m to a point $X_{i,m}$ on the grid $Z^2$+(0.5, 0.5) 262. The point $X_{i,m}$ is mapped to a constellation label [$z_{i,m}^{b_i}, z_{i,m}^{b_i-1}, d_{i,m}^{b_i-2}, \ldots, d_{i,m}^1, d_{i,m}^0$] 264 by the inverse mapping operation. The coset representative $z_{i,m}^{b_i}$ and $z_{i,m}^{b_i-1}$ are passed through the circuit $H_s(D)^T$ to obtain $d_{i,m}^{b_i-1}$ 266. The bit $d_{i,m}^{b_i-1}$ is combined with [$d_{i,m}^{b_i-2}, \ldots, d_{i,m}^1, d_{i,m}^0$] to produce the original message [$d_{i,m}^{b_i-1}, d_{i,m}^{b_i-2}, \ldots, d_{i,m}^1, d_{i,m}^0$]. Then, the tone index is incremented and the next tone is shaped until all tones are shaped.

INVERSE CONSTELLATION MAPPER

This section explains the two methods of inverse mapping operation.

Embedded Constellation

Note that $f_0(\bullet)$ denotes the operation of mapping labels to points on the embedded constellation with the original embedded labeling scheme, and $f_0^{-1}(\bullet)$ denotes the inverse of this mapping operation, which can be accomplished via table look-up. Given a 2D constellation point X from a $2^{b_i}$-point constellation, the inverse mapping operation, $f_0^{-1}$ [X], will generate the constellation label $c^{b_i-1}, c^{b_i-2}, \ldots, c^0$. If $b_i \leq 4$, no modification to the constellation label is required. Otherwise, the final label is obtained by modifying the constellation label as follows:

$c^{b_i-1}\ c^{b_i-2}=00 \rightarrow c^{b_i-1}, c^{b_i-2}, c^{b_i-3} \ldots, c^2, c^1, c^0$ $c^{b_i-1}\ c^{b_i-2}=01 \rightarrow \bar{c}^{b_i-1}, \bar{c}^{b_i-2}, \bar{c}^{b_i-3}, \ldots, \bar{c}^2, c^1, c^0$ $c^{b_i-1}\ c^{b_i-2}=10 \rightarrow \bar{c}^{b_i-1}, \bar{c}^{b_i-2}, c^{b_i-3}, \ldots, c^2, c^1, c^0$ $c^{b_i-1}\ c^{b_i-2}=11 \rightarrow c^{b_i-1}, c^{b_i-2}, \bar{c}^{b_i-3}, \ldots, \bar{c}^2, c^1, c^0$

Algorithmic Decoder

Figure 21:
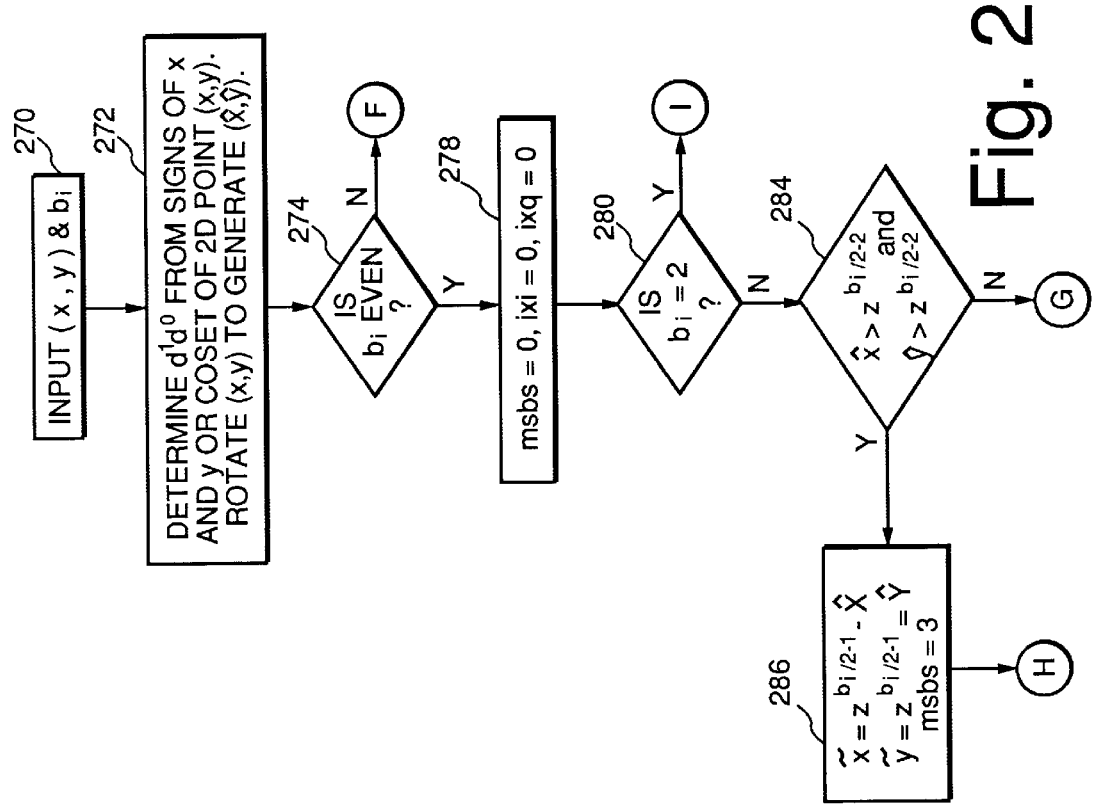
FIGS. 21–24 is a flowchart illustrating the steps of the algorithmic decoder to decode the received constellation point to the original message.

Referring to FIG. 21, the inputs to the algorithmic decoder are a point from the grid $Z^2$+(0.5, 0.5) and the number of bits represented by the point 270. First, $d^1 d^0$ is determined based on the signs of x and y or on the coset of $2Z^2$. Now rotate (x, y) by 0°, 90°, 180°, or 270° so that a new point $(\hat{x}, \hat{y})$, the second intermediate point, is in the first quadrant (or $\hat{x}$>0 and $\hat{y}$>0) 272. If $b_i$ is not even 274, the logic flows via connector F to FIG. 23. If $b_i$ is even 274, msbs, ixi and ixq are set to zero. Then, if $b_i$ equals 2 280, the logic flows to FIG. 22 via connector I. If $b_i$ does not equal to 2 280, $\hat{x}$>$2^{(b_i/2)-2}$, and $\hat{y}$>$2^{(b_i/2)-2}$, the first intermediate point, $\tilde{x}, \tilde{y}$, is set to $2^{(b_i/2)-1}$-$\hat{x}$ and $2^{(b_i/2)-1}$-$\hat{y}$ respectively, and msbs is set to 3 (or binary 11) 286. The program flows to FIG. 22 via connector H.

Figure 22:
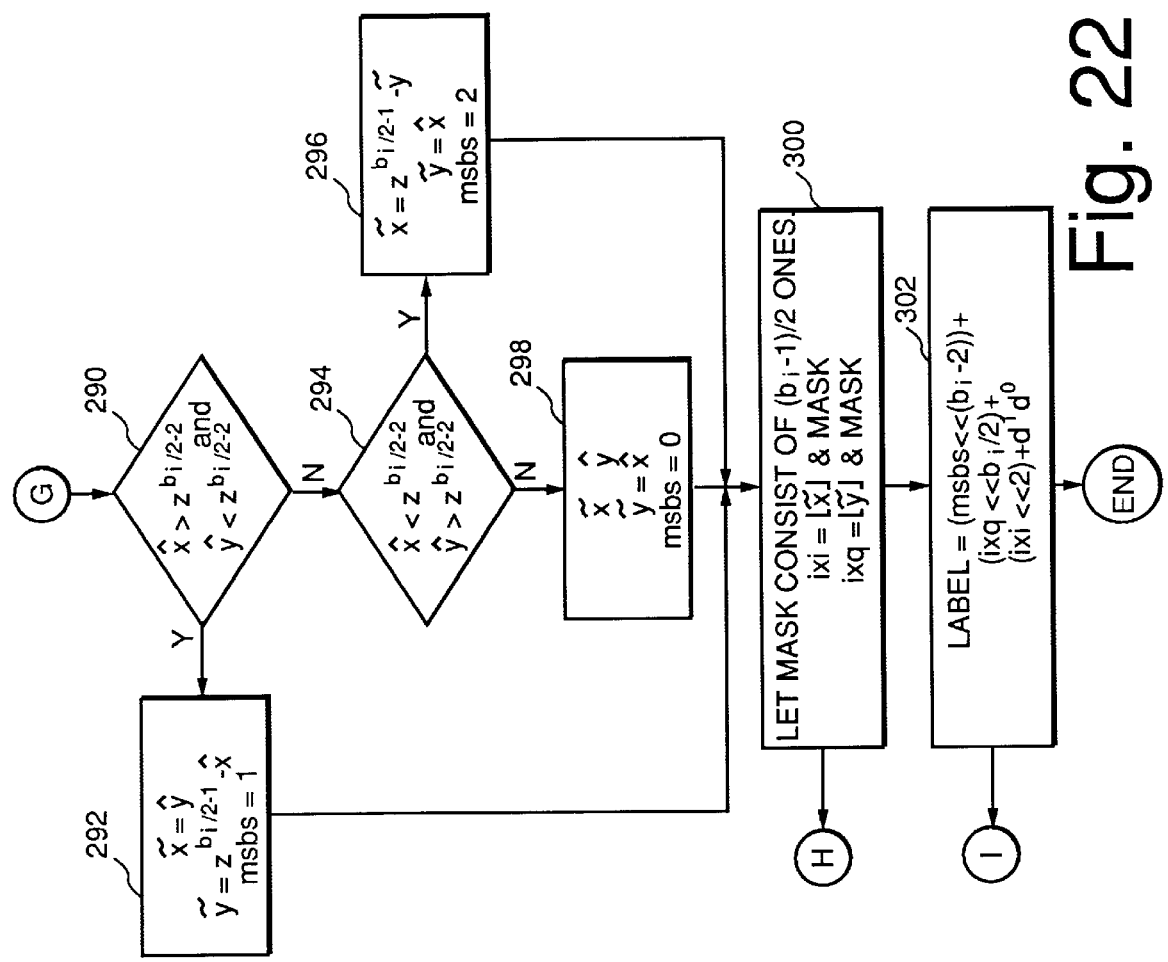

Referring to FIG. 22, from connector G, if $\hat{x}$>$2^{(b_i/2)-2}$ and $\hat{y}$<$2^{(b_i/2)-2}$, $\tilde{x}, \tilde{y}$ are set to $\hat{y}$ and $2^{(b_i/2)-1}$-$\hat{x}$ respectively, and msbs is set to 1. The program now flows to the next step 300. Otherwise, if $\hat{x}<2^{(b_y/2)-2}$ and $\hat{y}>2^{(b_y/2)-2}$, $\tilde{x}$, $\tilde{y}$ are set to $2^{(b_y/2)-1}-\hat{y}$ and $\hat{x}$ respectively, and msbs is set to 2 296. Else, $\tilde{x}$, $\tilde{y}$ are set to $\hat{y}$ and $\hat{x}$ respectively and msbs is set to zero 298. At this point $\tilde{x}$, $\tilde{y}$ has been set depending on the values of $\hat{x}$ and $\hat{y}$. Now, let the variable, mask, consist of $(b_i-4)/2$ ones. Ixi and ixq are set to $\lfloor \tilde{x} \rfloor$ & mask and $\lfloor \tilde{y} \rfloor$ & mask where $\lfloor \; \rfloor$ denotes taking the integer part of the variable and "&" denotes the binary "AND" operation. The label is determined by $(msbs<<(b_i-2))+(ixq<<b_i/2)+(ixi<<2)+d^1 d^0$, 302, where<<and>>denotes shifting to the left and the right respectively.

Figure 23:
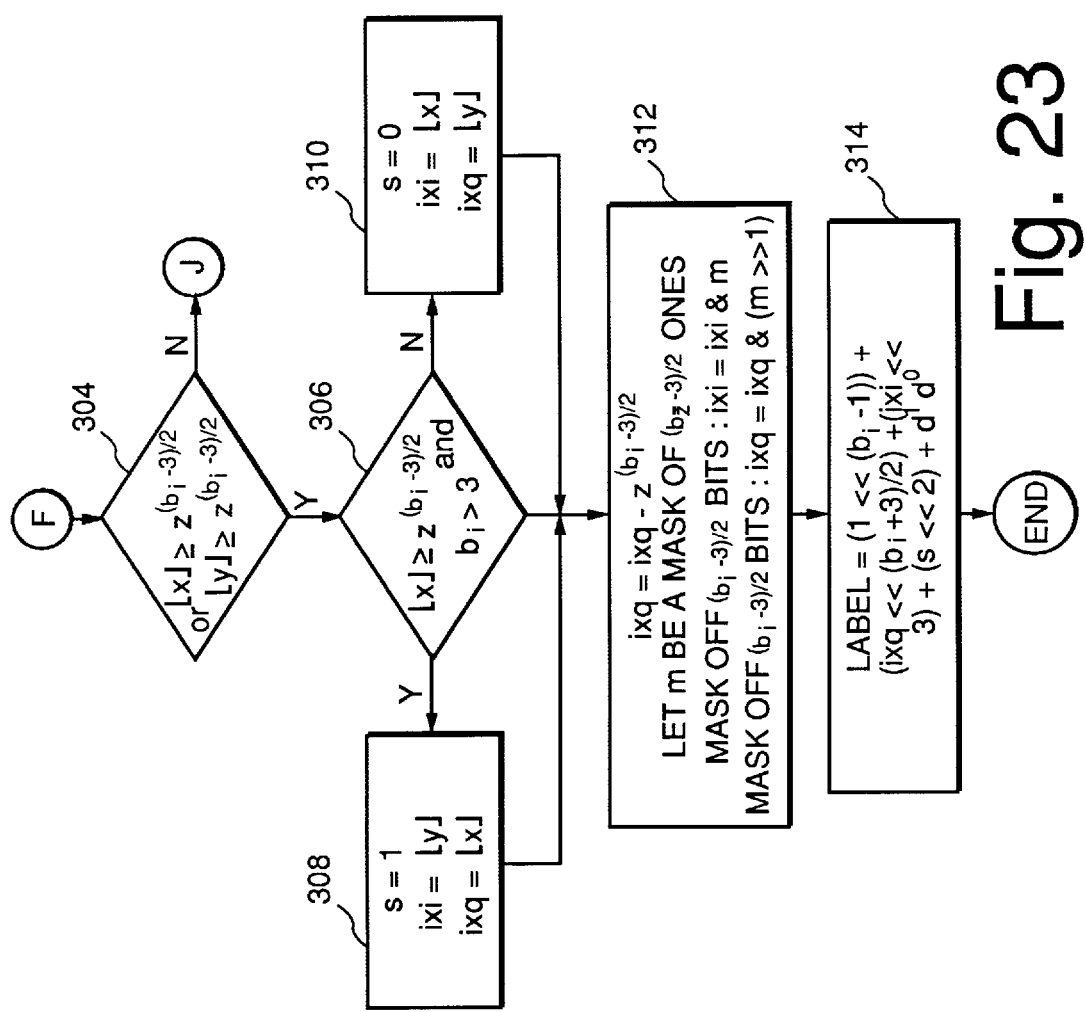
Figure 24:
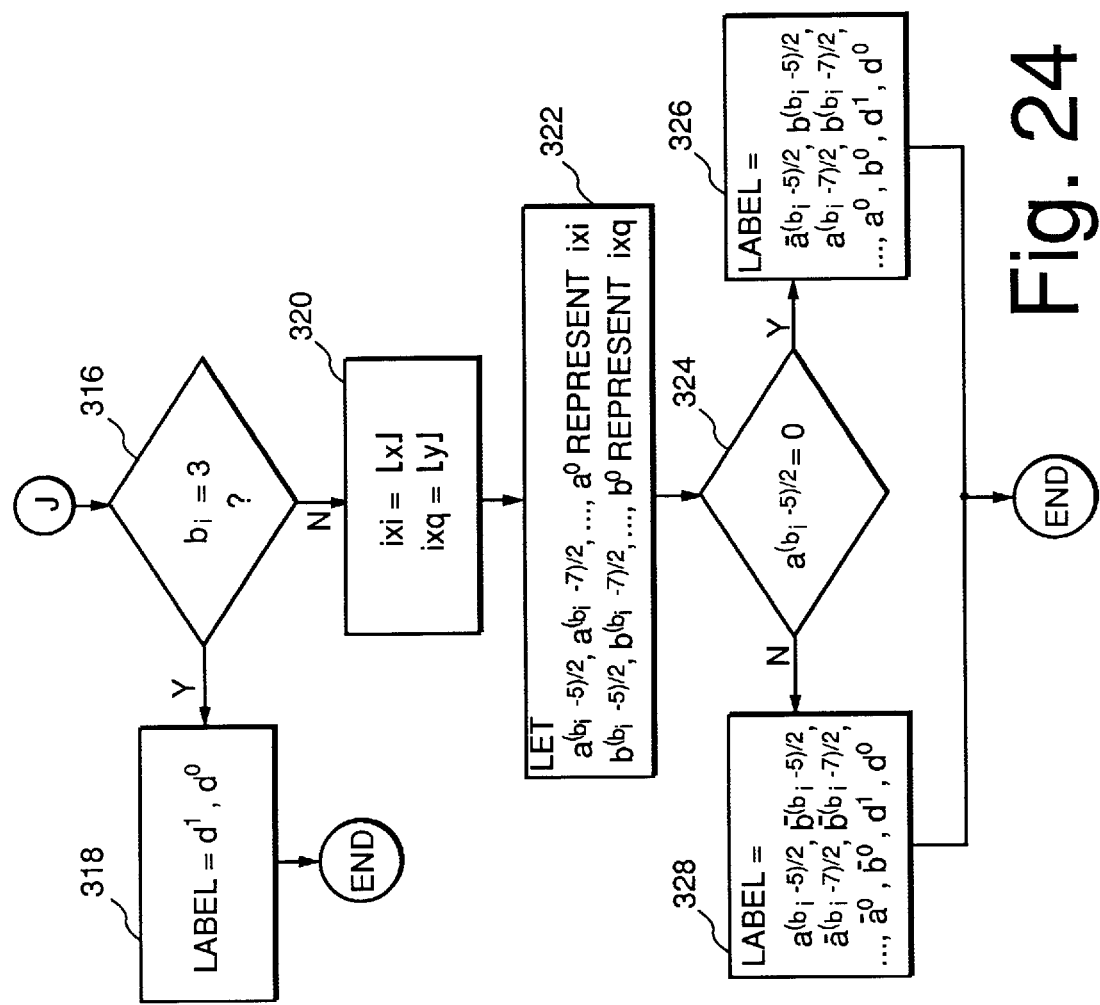

Referring to FIG. 23, connector F (from FIG. 21), if $\lfloor x \rfloor \geq 2^{(b_i-3)/2}$ or $\lfloor y \rfloor \geq 2^{(b_i-3)/2}$ 304, go to decision step 306. Else, the logic flows to FIG. 24 via connector J. If $\lfloor x \rfloor \geq 2^{(b_i-3)/2}$ and $b_i>3$ 306, a flag, S, is set to 1, and ixi and ixq are set to $\lfloor y \rfloor$ and $\lfloor x \rfloor$ respectively. Else flag S is set to 0 and ixi and ixq are set to $\lfloor x \rfloor$ and $\lfloor y \rfloor$ respectively. Then, ixq is reduced by $2^{(b_i-3)/2}$ 312. Now let the variable m consist of $(b_i-3)/2$ ones. Bits in ixi and ixq are masked off by setting ixi to (ixi & m) and ixq to (ixq & (m>>1)) 312. The final label equals $(1<<(b_i-1))+(ixq<<(b_i+3)/2)+(ixi<<3)+(S<<2)+d^1 d^0$ 314. In effect, for $b_i=3$ label=1, $d^1$, $d^0$ for $b_i=5$ label=1, *ixi*, *s*, $d^1$, $d^0$ for $b_i>5$ label=1, *ixq*, *ixi*, *s*, $d^1$, $d^0$ Referring to FIG. 24, connector J (from FIG. 23), if $b_i$ equals 3 316, the final label is set to $d^1 d^0$. Otherwise, ixi and ixq are set to $\lfloor x \rfloor$ and $\lfloor y \rfloor$ respectively 320. Now let [ $a^{(b_i-5)/2}$, $a^{(b_i-7)/2}$, ..., $a^0$ ] represent the bits in the quantity ixi and let [ $b^{(b_i-5)/2}$, $b^{(b_i-7)/2}$, ..., $b^0$ ] represent the bits in the quantity ixq 322. If $a^{(b_i-5)/2}$ equals 0 324, the final label equals [ $a^{(b_i-5)/2}$, $b^{(b_i-5)/2}$, $a^{(b_i-7)/2}$, $b^{(b_i-7)/2}$, ..., $a^0$, $b^0$, $d^1$, $d^0$ ] 326. Else, the final label equals [ $a^{(b_i-5)/2}$, $\overline{b}^{(b_i-5)/2}$, $\overline{a}^{(b_i-7)/2}$, $\overline{b}^{(b_i-7)/2}$, ..., $\overline{a}^0$, $\overline{b}^0$, $d^1$, $d^0$ ] 328.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method for shaping data for transmission by a multi-channel modulation system having $\overline{N}$ subchannels, comprising the steps of:

(a) allocating to each of said $\overline{N}$ subchannels a predetermined plurality of bits;

(b) sequentially trellis shaping the bits for each of said $\overline{N}$ subchannels in a predetermined order to generate trellis shaped constellation points for said subchannels; and (c) simultaneously modulating said constellation points for transmission.

2. A method as recited in claim 1 and further including the steps of:

(d) receiving said modulated constellation points; and (e) sequentially inverse trellis shaping a received constellation point for each said subchannel in said predetermined order to reproduce said bits allocated to each of said subchannels.

3. A method as recited in claim 2 wherein said allocated bits of each said subchannel have at least one most significant bit and said trellis shaping step includes the following substeps:

(1) using each said most significant bit to generate at least one region specifier bit;

(2) substituting said region specifier bit for said most significant bit to produce a constellation label; and (3) mapping said constellation label to produce a particular constellation point.

4. A method as recited in claim 3 wherein said multi-channel modulation system uses a Viterbi algorithm having at least two states, and said trellis shaping step further includes the substeps of:

(4) computing a power requirement for each of said states as a function of said particular constellation point and generating a corresponding branch metric extending a trellis diagram;

(5) updating the branch metrics for each said state;

(6) tracing back along a valid path of said trellis diagram to find a state having the lowest power requirement; and (7) generating a constellation point corresponding to the state having the lowest power requirement.

5. A method as recited in claim 3 wherein said trellis shaped constellation points are generated using a table look-up method where said trellis shaped constellation points are pre-calculated and stored in one or more tables.

6. A method as recited in claim 3 wherein said trellis shaped constellation points are generated using a predefined algorithmic encoder.

7. A method as recited in claim 6 wherein said algorithmic encoder performs the steps of:

for a constellation label with even number of bits, saving the two least significant bits of said constellation label, saving the two most significant bits of said constellation label, removing said two least significant bits and said two most significant bits from said constellation label, generating a first intermediate constellation point by incrementing selected bits of said constellation label by a predetermined value, generating a second intermediate constellation point as a function of said saved most significant bits, and rotating said second intermediate constellation point to a designated quadrant as a function of said saved least significant bits to produce a constellation point; and for a constellation label with odd number of bits, removing the two least significant bits from said constellation label, and saving said two least significant bits for subsequent use, if the most significant bit of said constellation label equals one, determining a first intermediate constellation point as a function of the number of bits in said constellation label and determining a second intermediate constellation point by summing said first intermediate constellation point with a predetermined value, if the most significant bit of said constellation label equals zero, generating said second intermediate constellation point as a function of the number of bits in said constellation label and the value of the second most significant bit, and rotating said second intermediate constellation point to a designated quadrant as a function of said saved least significant bits to produce a constellation point.

8. A method as recited in claim 2 wherein said inverse trellis shaping step includes the following substeps:

(1) inverse mapping said received constellation point to a predecoded constellation label having at least one region specifier bit;

(2) sending said region specifier bit through an inverse coset generator to generate at least one most significant bit; and (3) substituting said region specifier bit with said most significant bit from said predecoded constellation label to produce a decoded constellation point.

9. A method as recited in claim 1 wherein said allocated bits of each said subchannel have at least one most significant bit and said trellis shaping step includes the following substeps:

(1) using each said most significant bit to generate at least one region specifier bit;

(2) substituting said region specifier bit for said most significant bit to produce a constellation label; and (3) mapping said constellation label to produce a particular constellation point.

10. A method as recited in claim 9 wherein said multi-channel modulation system uses a Viterbi algorithm having at least two states, and said trellis shaping step further includes the substeps of:

(4) computing a power requirement for each of said states as a function of said particular constellation point and generating a corresponding branch metric extending a trellis diagram;

(5) updating the branch metrics for each said state;

(6) tracing back along a valid path of said trellis diagram to find a state having the lowest power requirement; and (7) generating a constellation point corresponding to the state having the lowest power requirement.

11. A method as recited in claim 1 wherein said trellis shaped constellation points are generated using a table look-up method where said trellis shaped constellation points are pre-calculated and stored in one or more tables.

12. A method as recited in claim 1 wherein said trellis shaped constellation points are generated using a predefined algorithmic encoder.

13. A method as recited in claim 12 wherein said algorithmic encoder performs the steps of:

for a constellation label with even number of bits, saving the two least significant bits of said constellation label, saving the two most significant bits of said constellation label, removing said two least significant bits and said two most significant bits from said constellation label, generating a first intermediate constellation point by incrementing selected bits of said constellation label by a predetermined value, generating a second intermediate constellation point as a function of said saved most significant bits, and rotating said second intermediate constellation point to a designated quadrant as a function of said saved least significant bits to produce a constellation point; and for a constellation label with odd number of bits, removing the two least significant bits from said constellation label, and saving said two least significant bits for subsequent use, if the most significant bit of said constellation label equals one, determining a first intermediate constellation point as a function of the number of bits in said constellation label and determining a second intermediate constellation point by summing said first intermediate constellation point with a predetermined value, if the most significant bit of said constellation label equals zero, generating said second intermediate constellation point as a function of the number of bits in said constellation label and the value of the second most significant bit, and rotating said second intermediate constellation point to a designated quadrant as a function of said saved least significant bits to produce a constellation point.

14. A method for shaping data for transmission by a multi-channel modulation system having $\overline{N}$ subchannels, and comprising the steps of:

(a) receiving modulated constellation points; and (b) sequentially inverse trellis shaping said received constellation points for said subchannels in a predetermined order to reproduce decoded constellation points corresponding in value to originally transmitted constellation points.

15. A method as recited in claim 14 wherein said inverse trellis shaping step is comprised of the following steps:

(1) inverse mapping a received constellation point to a predecoded constellation label having at least one region specifier bit;

(2) sending said region specifier bit through an inverse coset generator to generate at least one most significant bit; and (3) substituting said region specifier bit with said most significant bit from said predecoded constellation label to produce a decoded constellation point.

16. A method for shaping data for transmission by a multi-channel modulation system having $\overline{N}$ subchannels, comprising the steps of:

(a) allocating a predetermined number of bits for the $i^{th}$ subchannel of the $\overline{N}$ subchannels, where i increases from 0 to $\overline{N}$;

(b) generating at least one trellis shaped constellation point as a function of said bits;

(c) repeating steps (a)–(b) for each of said $\overline{N}$ subchannels in a predetermined order;

(d) simultaneously modulating the generated trellis shaped constellation points for said subchannels;

(e) repeating steps (a)–(d) for next blocks of bits.

17. An apparatus for shaping data for transmission by a multi-channel modulation system having $\overline{N}$ subchannels, comprising:

(a) means for allocating a predetermined number of bits for each of the $\overline{N}$ subchannels;

(b) means for sequentially generating trellis shaped constellation points in a predetermined order as functions of said allocated bits for said $\overline{N}$ subchannels;

(c) means for simultaneously modulating the generated trellis shaped constellation points for said subchannels.

18. An apparatus for shaping data for transmission by a multi-channel modulation system having $\overline{N}$ subchannels, comprising:

(a) means for receiving modulated constellation points; and (b) means for sequentially inverse trellis shaping said received constellation points for said subchannels in said predetermined order to reproduce decoded constellation points corresponding in value to the originally transmitted constellation points.

19. A method as recited in claim 8 wherein said inverse mapping step uses table look-up method to generate said predecoded constellation label.

20. A method as recited in claim 8 wherein said inverse mapping step uses an algorithmic decoder to generate said predecoded constellation label, wherein said algorithmic decoder executes steps functionally inverse to the steps used by said algorithmic encoder.

21. A method as recited in claim 15 wherein said inverse mapping step uses table look-up method to generate said predecoded constellation label.

22. A method as recited in claim 15 wherein said inverse mapping step uses an algorithmic decoder to generate said predecoded constellation label, wherein said algorithmic decoder executes steps functionally inverse to the steps used by said algorithmic encoder.

* * * * *